(12) United States Patent
Kuo et al.

(10) Patent No.: US 11,515,276 B2
(45) Date of Patent: Nov. 29, 2022

(54) INTEGRATED CIRCUIT, PACKAGE STRUCTURE, AND MANUFACTURING METHOD OF PACKAGE STRUCTURE

(71) Applicant: Taiwan Semiconductor Manufacturing Company, Ltd., Hsinchu (TW)

(72) Inventors: Hung-Jui Kuo, Hsinchu (TW); Hui-Jung Tsai, Hsinchu (TW); Tai-Min Chang, Taipei (TW); Chia-Wei Wang, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 37 days.

(21) Appl. No.: 17/006,879

(22) Filed: Aug. 30, 2020

(65) Prior Publication Data
US 2022/0068864 A1 Mar. 3, 2022

(51) Int. Cl.
*H01L 23/00* (2006.01)
*H01L 23/528* (2006.01)
*H01L 25/00* (2006.01)
*H01L 21/56* (2006.01)
*H01L 23/31* (2006.01)

(52) U.S. Cl.
CPC .............. *H01L 24/14* (2013.01); *H01L 21/56* (2013.01); *H01L 23/31* (2013.01); *H01L 23/528* (2013.01); *H01L 25/50* (2013.01)

(58) Field of Classification Search
CPC ......... H01L 24/14; H01L 21/56; H01L 23/31; H01L 23/528
See application file for complete search history.

(56) References Cited

U.S. PATENT DOCUMENTS

| | | | |
|---|---|---|---|
| 9,000,584 B2 | 4/2015 | Lin et al. | |
| 9,048,222 B2 | 6/2015 | Hung et al. | |
| 9,048,233 B2 | 6/2015 | Wu et al. | |
| 9,064,879 B2 | 6/2015 | Hung et al. | |
| 9,111,949 B2 | 8/2015 | Yu et al. | |
| 9,263,511 B2 | 2/2016 | Yu et al. | |
| 9,281,254 B2 | 3/2016 | Yu et al. | |
| 9,368,460 B2 | 6/2016 | Yu et al. | |
| 9,372,206 B2 | 6/2016 | Wu et al. | |
| 9,496,189 B2 | 11/2016 | Yu et al. | |
| 10,756,058 B2 * | 8/2020 | Shih | H01L 21/56 |
| 2021/0242172 A1 * | 8/2021 | Wang | H01L 25/0652 |
| 2021/0265311 A1 * | 8/2021 | Lu | H01L 23/3128 |
| 2021/0280517 A1 * | 9/2021 | May | H01L 23/5386 |
| 2022/0068864 A1 * | 3/2022 | Kuo | H01L 24/14 |

* cited by examiner

*Primary Examiner* — Thao P Le
(74) *Attorney, Agent, or Firm* — JCIPRNET

(57) ABSTRACT

An integrated circuit includes a semiconductor substrate, contact pads, testing pads, conductive posts, and dummy posts. The contact pads and the testing pads are distributed over the semiconductor substrate. The conductive posts are disposed on the contact pads. The dummy posts are disposed on the testing pads. A height of the conductive posts is greater than a height of the dummy posts.

20 Claims, 26 Drawing Sheets

INTEGRATED CIRCUIT, PACKAGE STRUCTURE, AND MANUFACTURING METHOD OF PACKAGE STRUCTURE

BACKGROUND

The semiconductor integrated circuit (IC) industry has experienced rapid growth. Over the course of this growth, functional density of the devices has generally increased by the device feature size. This scaling down process generally provides benefits by increasing production efficiency, lower costs, and/or improving performance. Such scaling down has also increased the complexities of processing and manufacturing ICs and, for these advances to be realized similar developments in IC fabrication are needed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
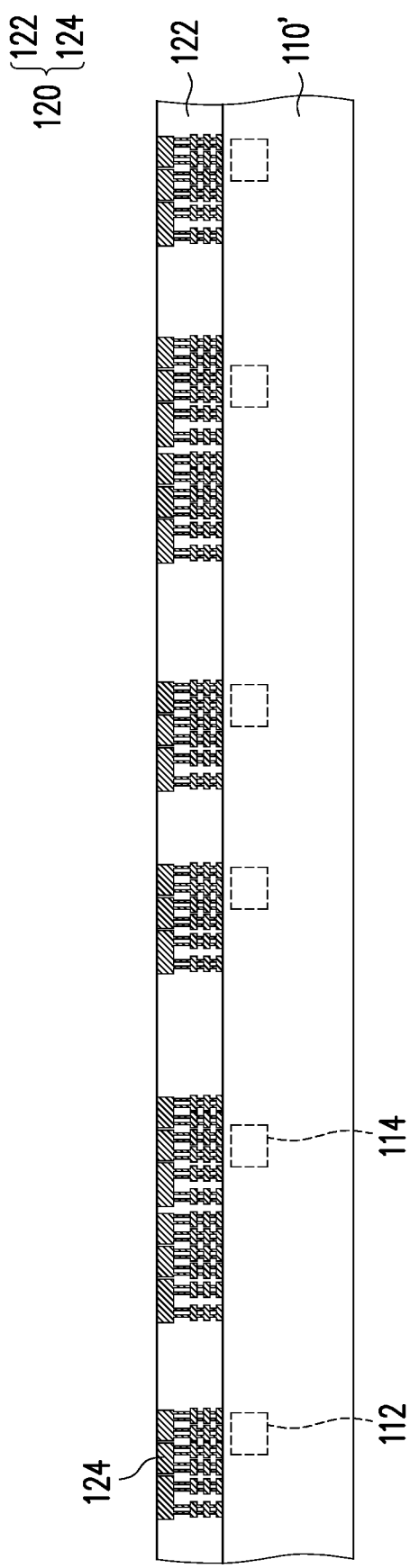
FIG. 1A to FIG. 1H are schematic cross-sectional views illustrating a manufacturing process of an integrated circuit in accordance with some embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIG. 1A to FIG. 1H are schematic cross-sectional views illustrating a manufacturing process of an integrated circuit 100 in accordance with some embodiments of the disclosure. Referring to FIG. 1A, a semiconductor wafer 110' is provided. In some embodiments, the semiconductor wafer 110' is made of a suitable elemental semiconductor, such as crystalline silicon, diamond, or germanium; a suitable compound semiconductor, such as gallium arsenide, silicon carbide, indium arsenide, or indium phosphide; or a suitable alloy semiconductor, such as silicon germanium carbide, gallium arsenic phosphide, or gallium indium phosphide. In some embodiments, the semiconductor wafer 110' has active components (e.g., transistors or the like) and/or passive components (e.g., resistors, capacitors, inductors, or the like) formed therein. In some embodiments, multiple active components and multiple passive components are formed within the semiconductor wafer 110'. Some of the active components and some of the passive components may be referred to as functional components 112. On the other hand, the remaining active components and the remaining passive components may be referred to as testing components 114. Throughout the entire disclosure, functional components 112 refer to components that are functional during operation of the subsequently formed integrated circuit or package structure. On the other hand, testing components 114 refer to components that are not functional or disabled during operation of the subsequently formed integrated circuit or package structure. The testing components 114 are utilized to test whether there are defects in the devices during the manufacturing process of the device. As illustrated in FIG. 1A, the functional components 112 and the testing components 114 are embedded in the semiconductor wafer 110'.

In some embodiments, an interconnection structure 120 is formed on the semiconductor wafer 110'. In some embodiments, the interconnection structure 120 includes an inter-dielectric layer 122 and a plurality of patterned conductive layers 124. For simplicity, the inter-dielectric layer 122 is illustrated as one bulky layer in FIG. 1A, but it should be understood that the inter-dielectric layer 122 may be constituted by multiple dielectric layers. The patterned conductive layers 124 and the dielectric layers of the inter-dielectric layer 122 are stacked alternately. In some embodiments, two adjacent patterned conductive layers 124 are electrically connected to each other through conductive vias sandwiched therebetween.

In some embodiments, a material of the inter-dielectric layer 122 includes polyimide, epoxy resin, acrylic resin, phenol resin, benzocyclobutene (BCB), polybenzoxazole (PBO), or other suitable polymer-based dielectric materials. The inter-dielectric layer 122, for example, is formed by suitable fabrication techniques such as spin-on coating, chemical vapor deposition (CVD), plasma-enhanced chemical vapor deposition (PECVD), or the like. In some embodiments, a material of the patterned conductive layers 124 includes aluminum, titanium, copper, nickel, tungsten, and/or alloys thereof. The patterned conductive layers 124 may be formed by electroplating, deposition, and/or photolithography and etching. It should be noted that the number of the patterned conductive layers 124 and the number of the dielectric layers in the inter-dielectric layer 122 shown in FIG. 1A are merely exemplary illustrations, and the disclosure is not limited. In some alternative embodiments, the number of the patterned conductive layers 124 and the number of the dielectric layers in the inter-dielectric layer 122 may be adjusted depending on the routing requirements.

In some embodiments, the functional components 112 and the testing components 114 are electrically connected to the interconnection structure 120. For example, the functional components 112 and the testing components 114 are electrically connected to the patterned conductive layers 124 of the interconnection structure 120.

Figure 1B:
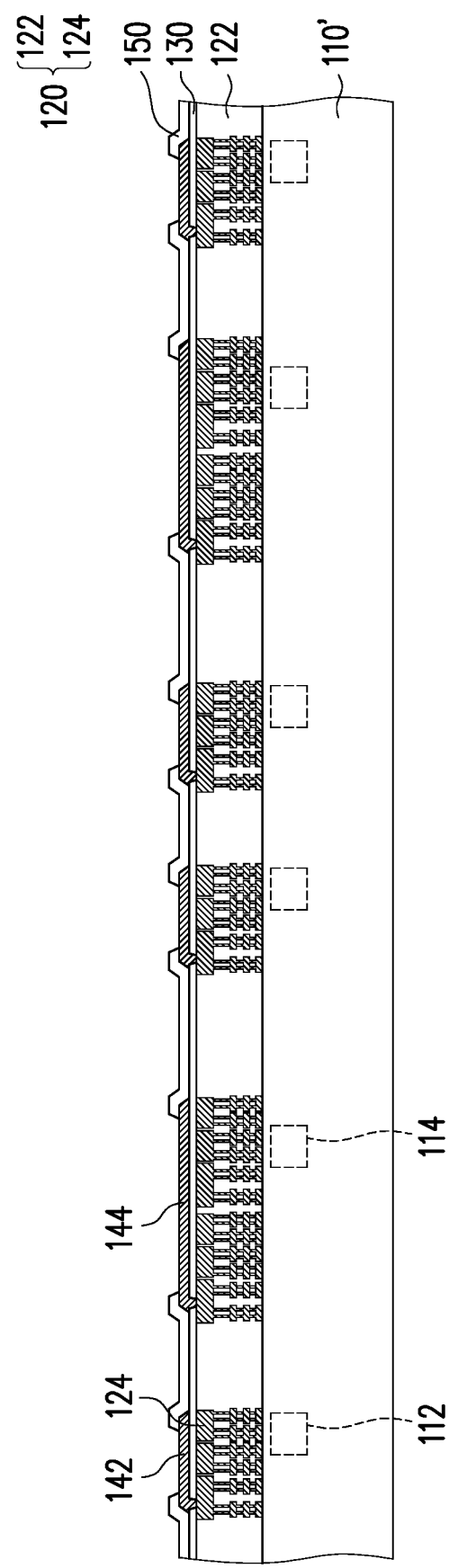

Referring to FIG. 1B, a dielectric layer 130 is formed on the interconnection structure 120. In some embodiments, a material of the dielectric layer 130 includes polyimide, epoxy resin, acrylic resin, phenol resin, BCB, PBO, or any other suitable polymer-based dielectric material. The dielectric layer 130, for example, is formed by suitable fabrication techniques such as spin-on coating, CVD, PECVD, or the like. In some embodiments, a plurality of openings is formed in the dielectric layer 130 to expose portions of the topmost patterned conductive layer 124. After the openings are formed, a plurality of contact pads 142 and a plurality of testing pads 144 are formed over the dielectric layer 130. Then, a passivation layer 150 is formed over the dielectric layer 130, the contact pads 142, and the testing pads 144. In some embodiments, the passivation layer 150 has a plurality of contact openings partially exposing each contact pad 142 and each testing pad 144. In some embodiments, the passivation layer 150 is a silicon oxide layer, a silicon nitride layer, a silicon oxy-nitride layer, or a dielectric layer formed by other suitable dielectric materials. In some embodiments, the passivation layer 150 is deposited using any suitable method, such as atomic layer deposition (ALD), CVD, high density plasma chemical vapor deposition (HDPCVD), PVD, or the like.

In some embodiments, locations of the contact pads 142 and the testing pads 144 correspond to locations of the openings of the dielectric layer 130. For example, the contact pads 142 and the testing pads 144 extend into the openings of the dielectric layer 130 to render electrical connection between the contact pads 142 and the interconnection structure 120 and between the testing pads 144 and the interconnection structure 120. In some embodiments, the contact pads 142 and the testing pads 144 are made of the same material. For example, the contact pads 142 and the testing pads 144 may be aluminum pads, copper pads, or other suitable metal pads. In some embodiments, the contact pads 142 and the testing pads 144 are simultaneously formed. The number and shape of the contact pads 142 and the testing pads 144 may be selected based on demand.

As illustrated in FIG. 1B, the contact pads 142 are formed directly above the functional components 112 while the testing pads 144 are formed directly above the testing pads 144. In some embodiments, the contact pads 142 are electrically connected to the functional components 112 via the interconnection structure 120. On the other hand, the testing pads 144 are electrically connected to the testing components 114 via the interconnection structure 120. In some embodiments, the contact pads 142 and the functional components 112 are electrically insulated from the testing pads 144 and the testing components 114.

Figure 2:
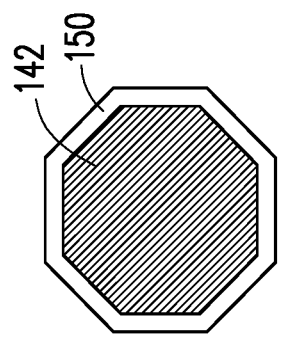
FIG. 2 is a partial schematic top view of FIG. 1B illustrating the contact pads and the testing pad.
Figure 2:
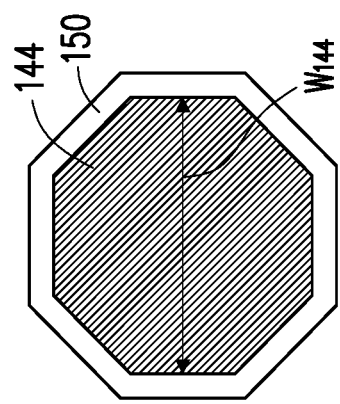
Figure 2:
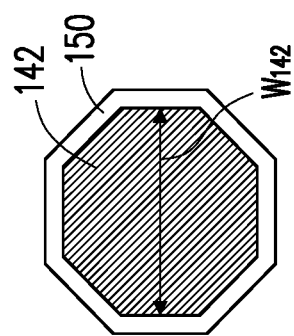

In some embodiments, a size of the contact pads 142 is different from a size of the testing pads 144. The dimensions of the contact pads 142 and the testing pads 144 will be described below in conjunction with FIG. 2. FIG. 2 is a partial schematic top view of FIG. 1B illustrating the contact pads 142 and the testing pad 144. Referring to FIG. 1B and FIG. 2, a size of the testing pads 144 is greater than a size of the contact pads 142. For example, a width $W_{142}$ of the contact pads 142 ranges between 10 μm and 50 μm. On the other hand, a width $W_{144}$ of the testing pads 144 ranges between 20 μm and 100 μm. In some embodiments, a ratio of the width $W_{144}$ of the testing pads 144 to the width $W_{142}$ of the contact pads 142 ranges between 2:1 and 5:1. In some embodiments, shapes of the contact pads 142 and the testing pads 144 are both octagonal from the top view. However, the disclosure is not limited thereto. In some alternative embodiments, shapes of the contact pads 142 and the testing pads 144 may be circular, elliptical, or other polygonal. Although FIG. 2 illustrated that the shape of the contact pads 142 is the same as the shape of the testing pads 144, the disclosure is not limited thereto. In some alternative embodiments, the shape of the contact pads 142 may be different from the shape of the testing pads 144.

In some embodiments, after the testing pads 144 are formed over the semiconductor wafer 110', a wafer testing operation (sometimes referred to as wafer final test or circuit probing) may be performed to identify known good dies. For example, the testing pads 144 are probed to determine whether there are defects in the testing components 114 and/or functional components 112. After completing the wafer testing operation and the quality of the wafer is ensured, the manufacturing process of the integrated circuit 100 may be continued.

Figure 1C:
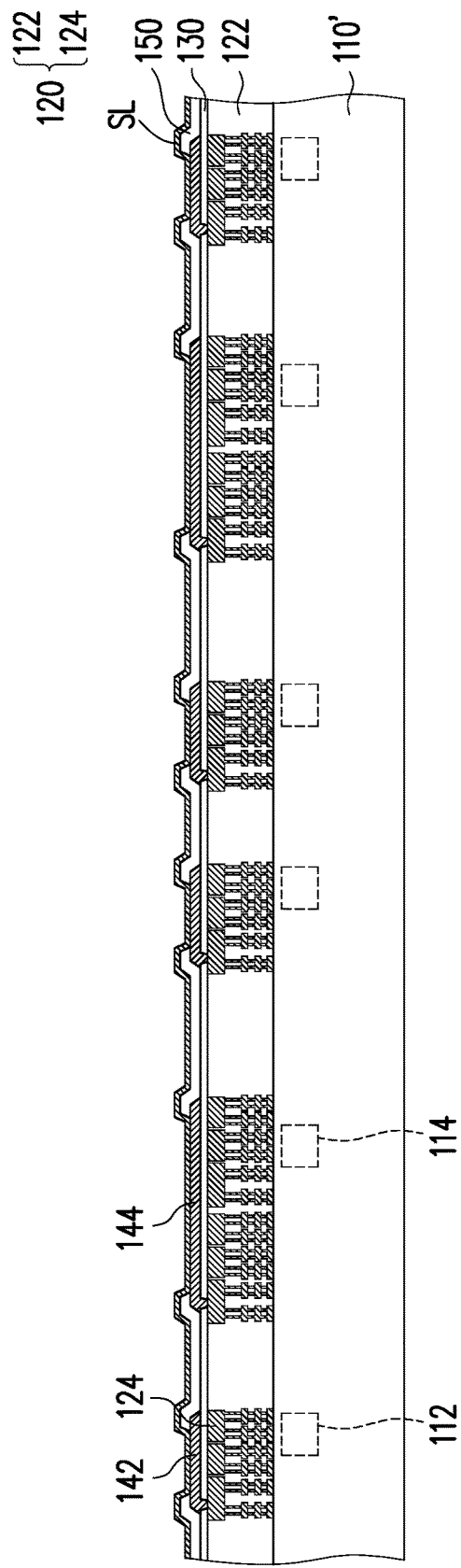

Referring to FIG. 1C, a seed layer SL is deposited on the contact pads 142, the testing pads 144, and the passivation layer 150. The seed layer SL may be formed through a sputtering process, a physical vapor deposition (PVD) process, or the like. In some embodiments, the seed layer SL includes titanium, copper, or a combination thereof. As illustrated in FIG. 1C, the seed layer SL is conformally formed on the contact pads 142, the testing pads 144, and the passivation layer 150.

Figure 1D:
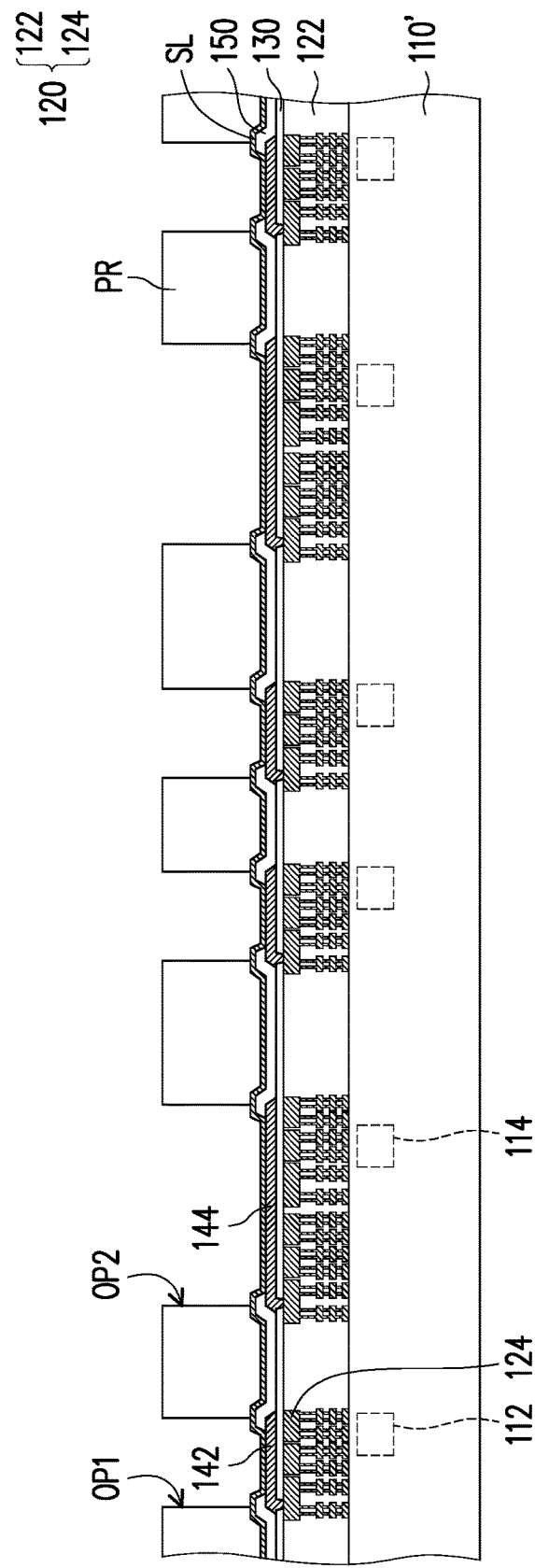

Referring to FIG. 1D, a patterned photoresist layer PR is formed over the seed layer SL. In some embodiments, the patterned photoresist layer PR is made of a photosensitive material. In some embodiments, the patterned photoresist layer PR has a plurality of openings OP1 and a plurality of openings OP2. The openings OP1 and the openings OP2 of the patterned photoresist layer PR partially expose the seed layer SL above the contact pads 142 and the testing pads 144. In some embodiments, locations of the openings OP1 correspond to locations of the contact pads 142 while locations of the openings OP2 correspond to locations of the testing pads 144. That is, the openings OP1 expose the seed layer SL located directly above the contact pads 142 and the openings OP2 expose the seed layer SL located directly above the testing pads 144. In some embodiments, each opening OP2 is larger than each opening OP1.

Figure 1E:
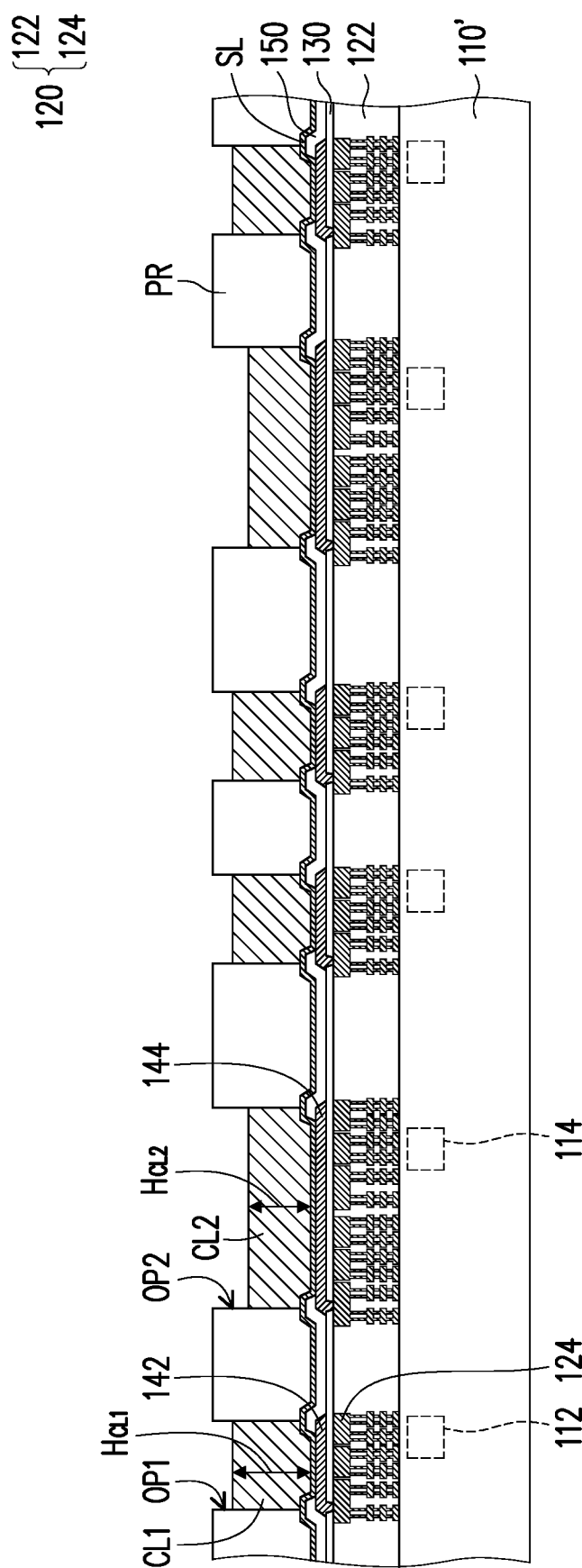

Referring to FIG. 1E, a conductive material layer CL1 and a conductive material layer CL2 are deposited onto the exposed seed layer SL. For example, the conductive material layer CL1 is filled into the openings OP1 while the conductive material layer CL2 is filled into the openings OP2. In some embodiments, the conductive material layer CL1 and the conductive material layer CL2 are formed through a plating process. The plating process is, for example, an electro-plating process, an electroless-plating process, an immersion plating process, or the like. In some embodiments, the conductive material layer CL1 and the conductive material layer CL2 are simultaneously formed. In some embodiments, the conductive material layer CL1 and the conductive material layer CL2 may be made of the same material. For example, the conductive material layer CL1 and the conductive material layer CL2 are made of aluminum, titanium, copper, nickel, tungsten, and/or alloys thereof. In some embodiments, since the opening OP2 is greater than the opening OP1, the deposition rate of the conductive material layer CL2 is slower than the deposition rate of the conductive material layer CL1. As a result, a height $H_{CL1}$ of the conductive material layer CL1 is greater than a height $H_{CL2}$ of the conductive material layer CL2.

Figure 1F:
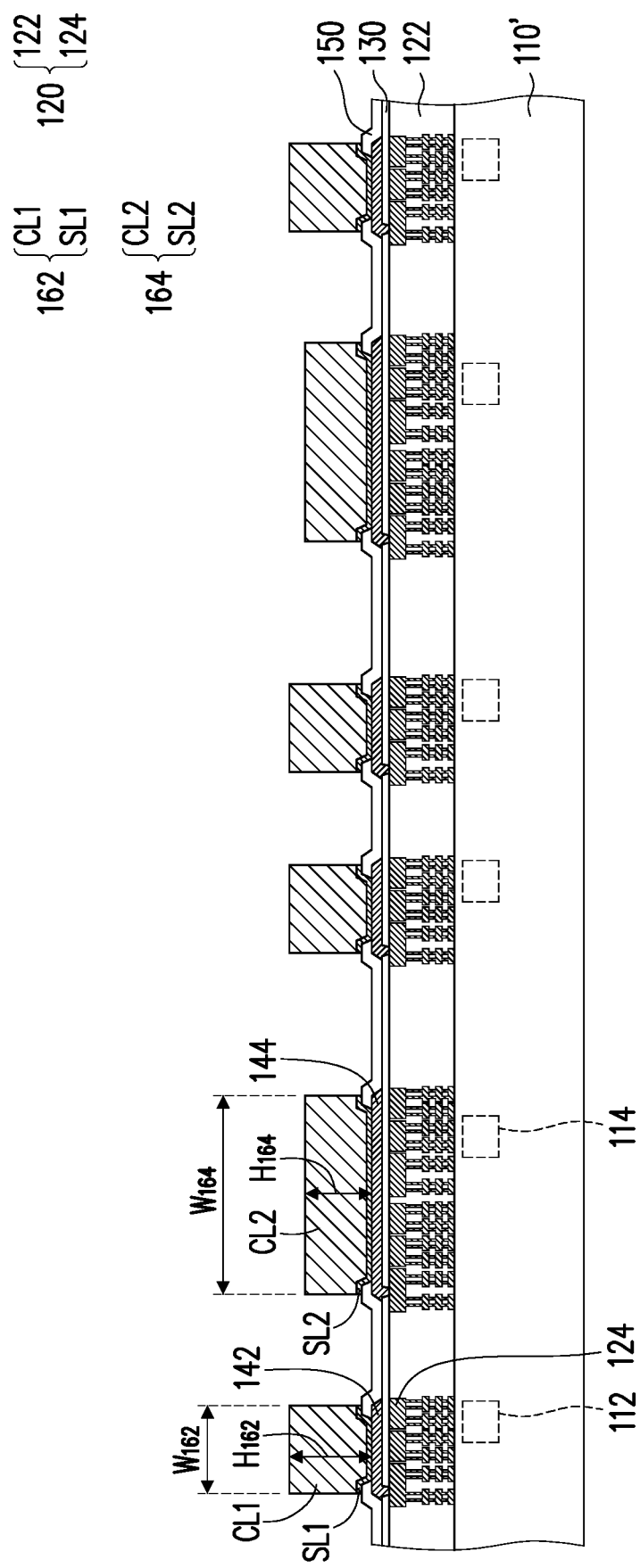

Referring to FIG. 1F, the patterned photoresist layer PR is removed. The patterned photoresist layer PR may be removed through an etching process, a stripping process, an ashing process, a combination thereof, or the like. Thereafter, by using the conductive material layer CL1 and the conductive material layer CL2 as hard masks, the seed layer SL that is uncovered by the conductive material layer CL1 and the conductive material layer CL2 may be removed. In some embodiments, portions of the seed layer SL are removed through an etching process. After removal of portions of the seed layer SL, the remaining seed layer SL is divided into a seed layer SL1 and a seed layer SL2. In some embodiments, the seed layer SL1 is located underneath the conductive material layer CL1. That is, the seed layer SL1 is sandwiched between the contact pads 142 and the conductive material layer CL1. On the other hand, the seed layer SL2 is located underneath the conductive material layer CL2. That is, the seed layer SL2 is sandwiched between the testing pads 144 and the conductive material layer CL2.

In some embodiments, the seed layer SL1 and the conductive material layer CL1 are collectively referred to as conductive posts 162. On the other hand, the seed layer SL2 and the conductive material layer CL2 are collectively referred to as dummy posts 164. In other words, the conductive posts 162 are formed on the contact pads 142 and the dummy posts 164 are formed on the testing pads 144. In some embodiments, the conductive posts 162 and the dummy posts 164 are simultaneously formed. In some embodiments, the conductive posts 162 are electrically connected to the contact pads 142 and the functional components 112. That is, the conductive posts 162 are able to transmit signal between the functional components 112 and other subsequently formed elements. On the other hand, the dummy posts 164 are electrically connected to the testing pads 144 and the testing components 114. However, since other subsequently formed elements would not be formed to be in electrical connection with the dummy posts 164, the dummy posts 164 are formed to be electrically floating.

As mentioned above, the height $H_{CL2}$ of the conductive material layer CL2 is smaller than the height $H_{CL1}$ of the conductive material layer CL1. Since the seed layer SL1 and the seed layer SL2 have substantially the same height, the dummy posts 164 are formed to be shorter than the conductive posts 162. That is, a height $H_{162}$ of the conductive posts 162 is greater than a height $H_{164}$ of the dummy posts 164. However, the disclosure is not limited thereto. In some alternative embodiments, if the plating process for forming the conductive material layer CL1 and the conductive material layer CL2 is performed longer and the excessive conductive material layer CL1 and/or conductive material layer CL2 is removed through a grinding process, the height $H_{162}$ of the conductive posts 162 may be substantially equal to the height $H_{164}$ of dummy posts 164.

In some embodiments, a width $W_{162}$ of the conductive posts 162 may be substantially equal to the width $W_{142}$ (shown in FIG. 2) of the contact pads 142. Similarly, a width $W_{164}$ of the dummy posts 164 may be substantially equal to the width $W_{144}$ (shown in FIG. 2) of the testing pads 144. As a result, the width $W_{164}$ of the dummy posts 164 is greater than the width $W_{162}$ of the conductive posts 162. That is, the conductive posts 162 are formed to be slimmer than the dummy posts 164, as illustrated in FIG. 1F.

Figure 1G:
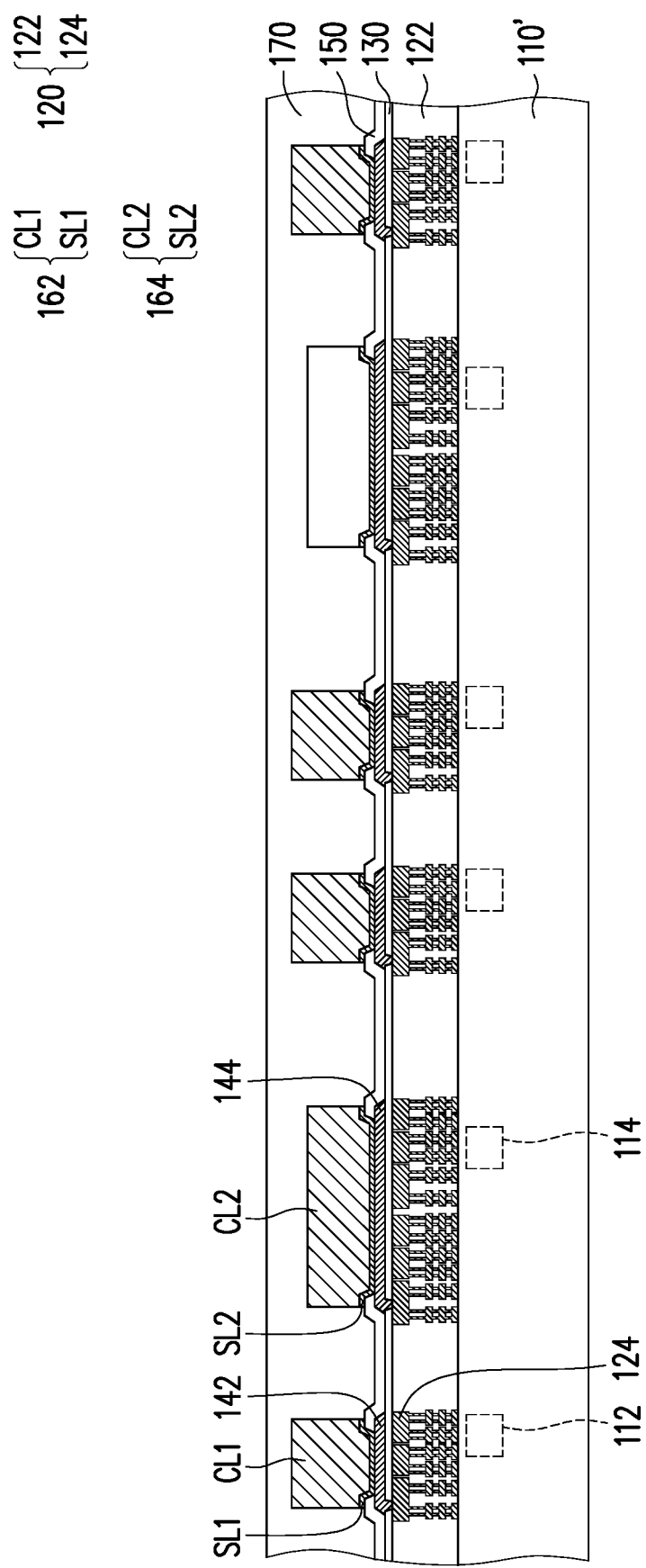

Referring to FIG. 1G, after the conductive posts 162 and the dummy posts 164 are formed, a protection layer 170 is formed over the passivation layer 150 to cover the conductive posts 162 and the dummy posts 164. In some embodiments, the protection layer 170 includes polymer, epoxy, the like, or a combination thereof. In some embodiments, the protection layer 170 is formed by a suitable fabrication technique, such as spin-on coating, lamination, deposition, molding, or the like. As illustrated in FIG. 1G, the protection layer 170 encapsulates the conductive posts 162 and the dummy posts 164. In some embodiments, a distance between top surfaces of the conductive posts 162 and a top surface of the protection layer 170 is smaller than a distance between top surfaces of the dummy posts 164 and the top surface of the protection layer 170.

Figure 1H:
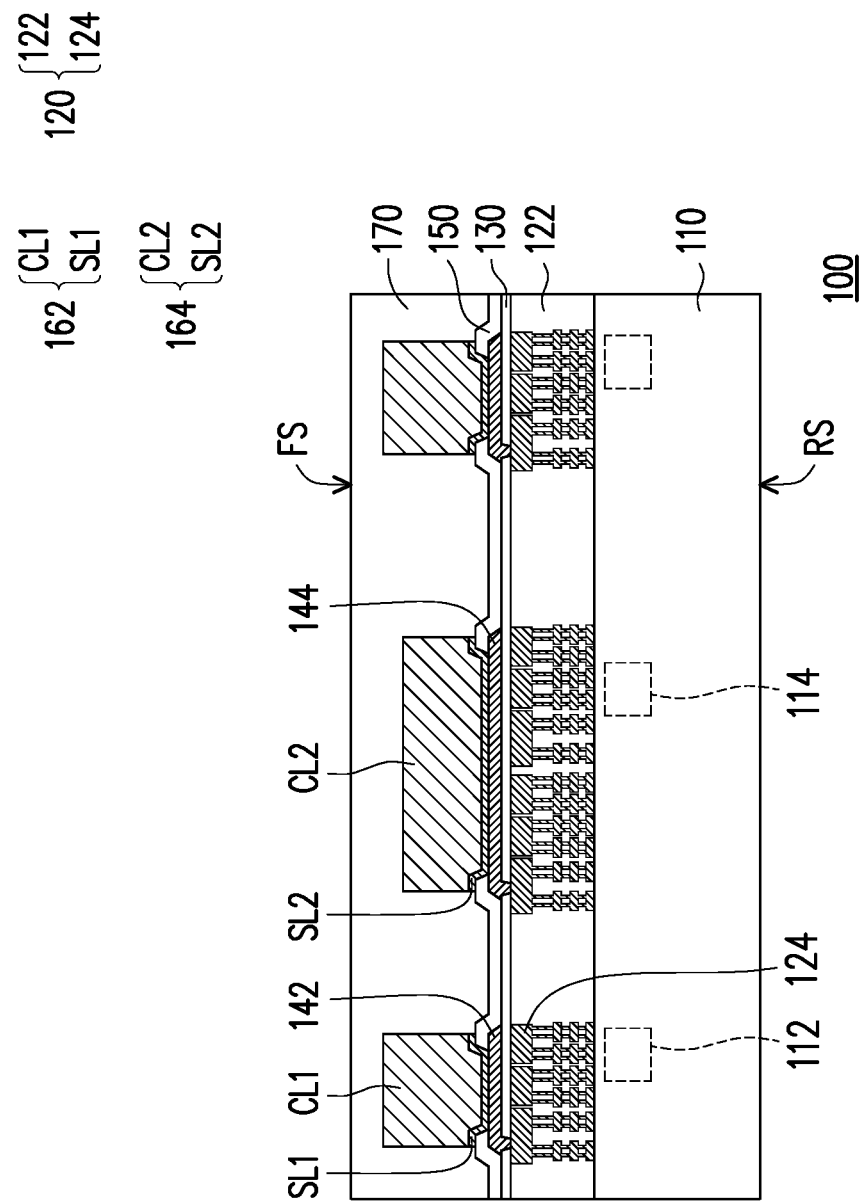

Referring to FIG. 1G and FIG. 1H, the structure illustrated in FIG. 1G is singulated to render a plurality of integrated circuits 100. In some embodiments, the singulation process typically involves dicing with a rotation blade and/or a laser beam. In other words, the singulation process includes a laser cutting process, a mechanical cutting process, a laser grooving process, other suitable processes, or a combination thereof. For example, a laser grooving process may be performed on the structure illustrated in FIG. 1H to form a trench (not shown) in the said structure. Thereafter, a mechanical cutting process may be performed on the location of the trench to cut through the said structure, so as to divide the semiconductor wafer 110' into semiconductor substrates 110 and to obtain the integrated circuit 100.

In some embodiments, each integrated circuit 100 includes the semiconductor substrate 110, the interconnection structure 120, the dielectric layer 130, the contact pads 142, the testing pads 144, the passivation layer 150, the conductive posts 162, the dummy posts 164, and the protection layer 170. The contact pads 142 and the testing pads 144 are distributed over the semiconductor substrate 110. The conductive posts 162 are disposed on the contact pads 142 and the dummy posts 164 are disposed on the testing pads 144. In some embodiments, each conductive post 162 includes the seed layer SL1 and the conductive material layer CL1. The seed layer SL1 covers the contact pads 142 and the conductive material layer CL1 is disposed on the seed layer SL1. Similarly, each dummy post 164 includes the seed layer SL2 and the conductive material layer CL2. The seed layer SL2 covers the testing pads 144 and the conductive material layer CL2 is disposed on the seed layer SL2. The protection layer 170 seals the conductive posts 162 and the dummy posts 164 to protect these elements. As illustrated in FIG. 1H, the integrated circuit 100 has a front surface FS and a rear surface RS opposite to the front surface FS. In the conventional integrated circuit, no post is formed over the testing pads. During the formation of the conductive posts on the contact pads, seed layer is deposited on the testing pads. However, due to reactivity difference between the seed layer and the underlying testing pads, after performing the etching process to partially remove the seed layer, there would be residues of the seed layer remaining on the testing pads. These residues of the seed layer remaining on the testing pads would compromise the device performance of the subsequently formed integrated circuit. On the contrary, as illustrated in FIG. 1E to FIG. 1H, the seed layer SL2 on the testing pads 144 of the integrated circuit 100 is not removed, and dummy posts 164 are formed. As such, the issues derived from seed layer residues may be sufficiently resolved, thereby ensuring device performance.

In some embodiments, the integrated circuit 100 in FIG. 1H may be utilized in various package structures. These package structures will be described below.

Figure 3A:
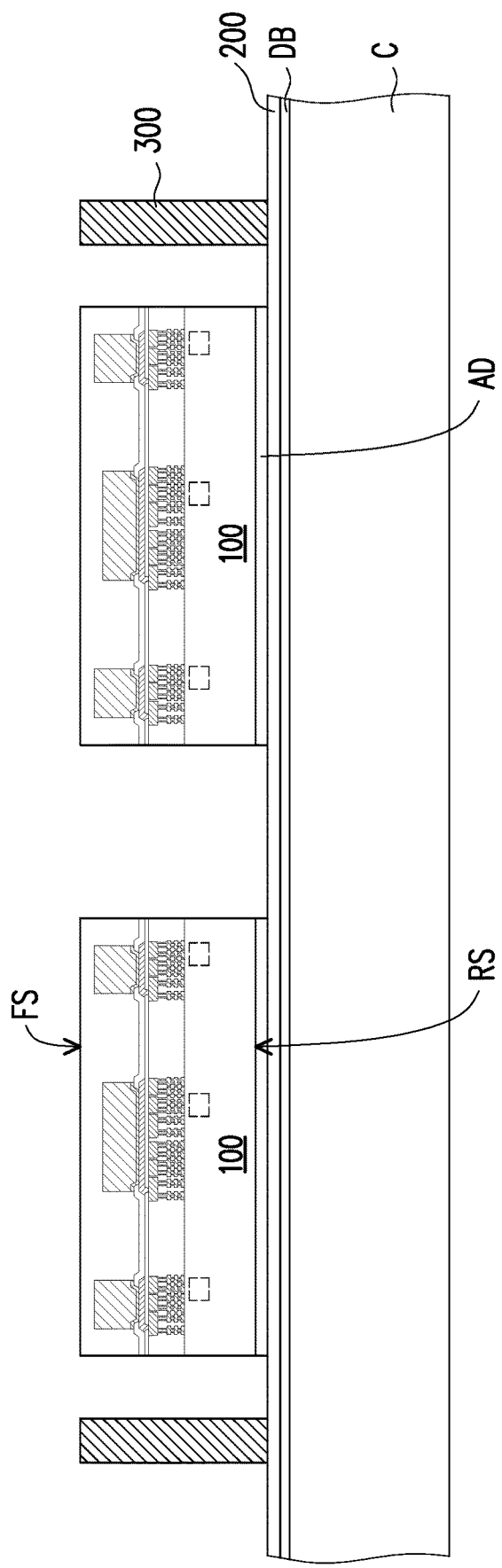
FIG. 3A to FIG. 3I are schematic cross-sectional views illustrating a manufacturing process of a package structure in accordance with some embodiments of the disclosure.

FIG. 3A to FIG. 3I are schematic cross-sectional views illustrating a manufacturing process of a package structure 10 in accordance with some embodiments of the disclosure. Referring to FIG. 3A, a carrier C having a de-bonding layer DB formed thereon is provided. In some embodiments, the carrier C is a glass substrate. However, other suitable materials may be adapted as a material of the carrier C as long as the material is able to withstand the subsequent processes while carrying the package structure formed thereon. In some embodiments, the de-bonding layer DB is a light-to-heat conversion (LTHC) release layer formed on the glass substrate. The de-bonding layer DB may allow the structure formed on the carrier C in the subsequent processes to be peeled off from the carrier C.

In some embodiments, a dielectric layer 102 is formed on the de-bonding layer DB. In some embodiments, the dielectric layer 102 is formed of polymeric materials. Examples of the polymeric material include polyimide, BCB, PBO, or the like. In some alternative embodiments, the dielectric layer 102 may include non-organic dielectric materials such as silicon oxide, silicon nitride, silicon carbide, silicon oxynitride, or the like.

As illustrated in FIG. 3A, a plurality of conductive structures 300 is provided over the dielectric layer 102. For example, pre-fabricated conductive structures 300 may be picked and placed onto the dielectric layer 102. In some embodiments, a plurality of integrated circuits 100 illustrated in FIG. 1H are also provided over the dielectric layer 102. In some embodiments, the integrated circuits 100 are adhered to the dielectric layer 102 through an adhesive layer AD. For example, the rear surfaces RS of the integrated circuits 100 are attached to the dielectric layer 102 through the adhesive layer AD. In some embodiments, the adhesive layer AD includes a die attach film (DAF) or the like. In some embodiments, the integrated circuits 100 are picked and placed onto the dielectric layer 102 such that the front surfaces FS face upward. In some embodiments, the integrated circuits 100 are arranged in an array and are surrounded by the conductive structures 300. It should be noted that in some embodiments, the placement of the conductive structures 300 are omitted. That is, the conductive structures 300 may be optional.

Figure 3B:
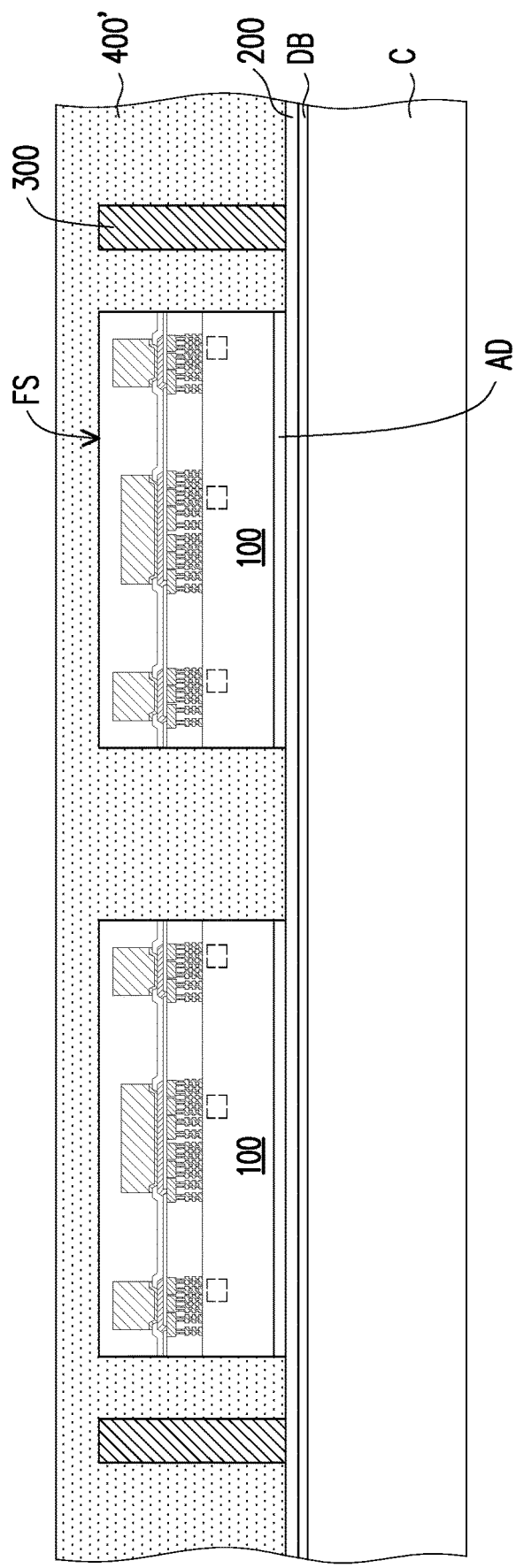

Referring to FIG. 3B, an encapsulation material 400' is formed over the dielectric layer 200 to encapsulate the conductive structures 300 and the integrated circuits 100. In other words, the conductive structures 300 and integrated circuits 100 are not revealed and are well protected by the encapsulation material 400'. For example, the encapsulation material 400' is formed to cover the front surfaces FS of the integrated circuits 100. In some embodiments, the encapsulation material 400' includes a molding compound, a molding underfill, a resin (such as epoxy), or the like. In some embodiments, the encapsulation material 400' includes fillers. In some embodiments, the encapsulation material 400' is formed by a molding process. For example, the encapsulation material 400' may be formed by a compression molding process.

Figure 3C:
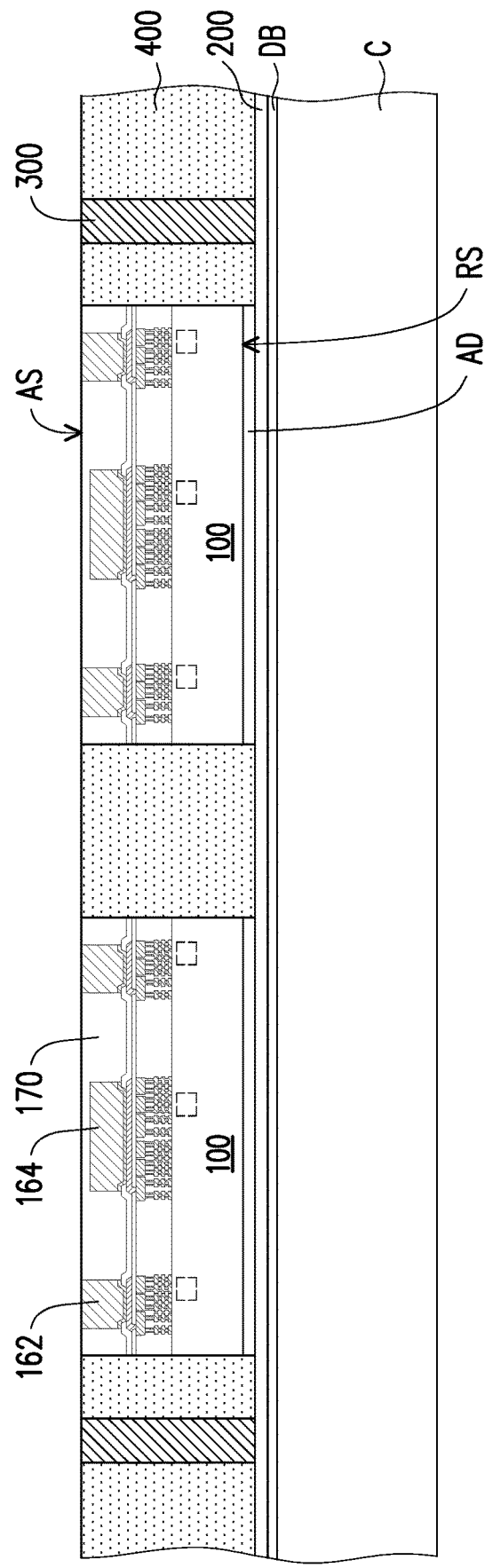

Referring to FIG. 3B and FIG. 3C, the encapsulation material 400' and the protection layers 170 of the integrated circuits 100 are grinded until top surfaces of the conductive posts 162 and top surfaces of the conductive structures 300 are exposed. After the encapsulation material 400' is grinded, an encapsulant 400 is formed over the dielectric layer 200 to encapsulate the conductive structures 300 and the integrated circuits 100. In some embodiments, the encapsulation material 400' is grinded by a mechanical grinding process and/or a chemical mechanical polishing (CMP) process. In some embodiments, during the grinding process of the encapsulation material 400', the protection layers 170 are grinded to reveal the conductive posts 162. On the other hand, the dummy posts 164 are still protected by the protection layers 170 and are not revealed. In some embodiments, portions of the conductive posts 162 and portions of the conductive structures 300 are slightly grinded as well. After grinding, each integrated circuit 100 has an active surface AS opposite to the rear surface RS. The exposed portion of the conductive posts 162 is located on the active surfaces AS of the integrated circuits 100. In some embodiments, the encapsulant 400 encapsulates sidewalls of the integrated circuits 100 and sidewalls of the conductive structures 300. In other words, the encapsulant laterally encapsulates the integrated circuits 100 and the conductive structures 300. In some embodiments, top surfaces of the conductive structures 300, top surfaces of the conductive posts 162, and top surfaces of the protection layers 170 are substantially coplanar with a top surface of the encapsulant 400.

Figure 3D:
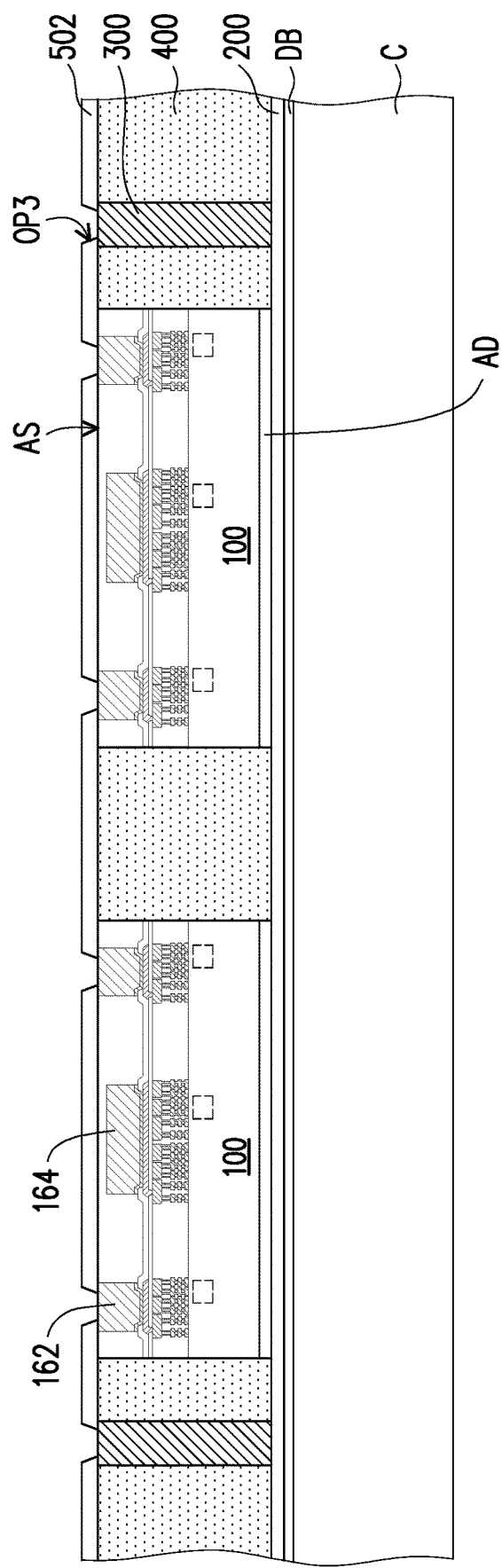

Referring to FIG. 3D, a dielectric layer 502 is formed over the integrated circuits 100, the conductive structures 300, and the encapsulant 400. The dielectric layer 502 has a plurality of openings OP3 exposing the conductive structures 300 and the conductive posts 162. For example, the openings OP3 of the dielectric layer 502 may be formed corresponding to the top surfaces of the conductive structures 300 and the top surfaces of the conductive posts 162. In some embodiments, the dielectric layer 502 is formed of polyimide, epoxy resin, acrylic resin, phenol resin, BCB, PBO, or any other suitable polymer-based dielectric materials.

Figure 3E:
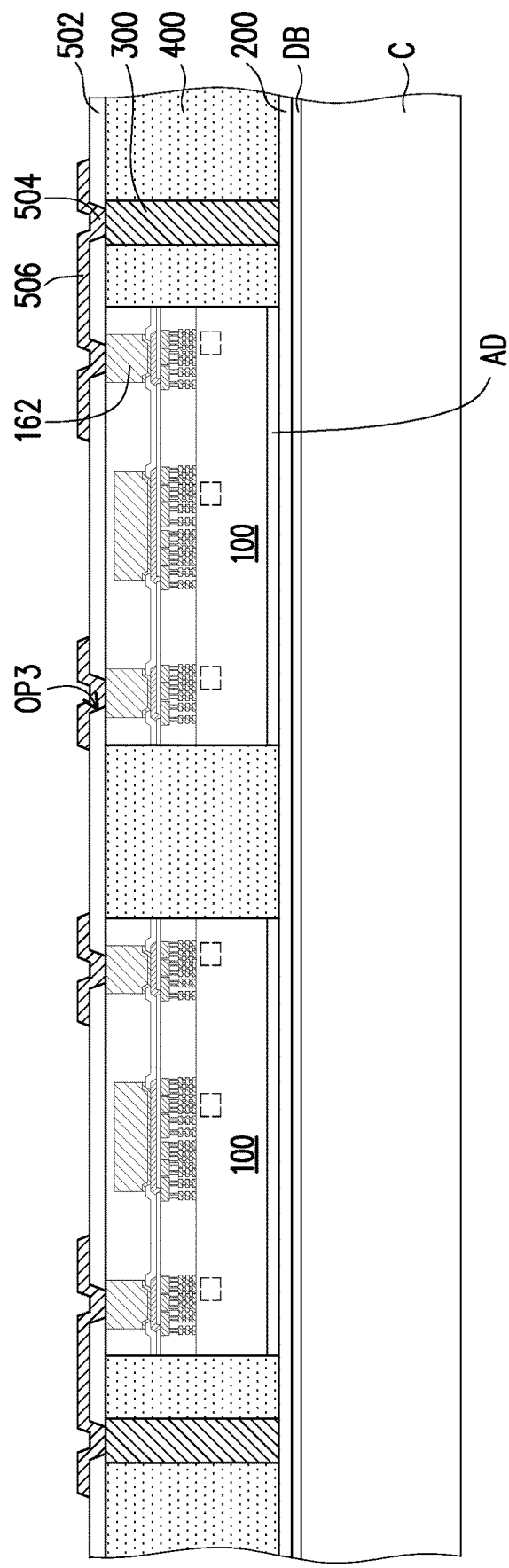

Referring to FIG. 3E, a plurality of conductive vias 504 is formed within the openings OP3 of the dielectric layer 502. Meanwhile, a plurality of routing patterns 506 is formed over the dielectric layer 502. In some embodiments, the conductive vias 504 and the routing patterns 506 are simultaneously formed. In some embodiments, each conductive via 504 is connected to the corresponding routing pattern 506. In some embodiments, the conductive vias 504 are directly in contact with the conductive posts 162 of the integrated circuits 100 and the conductive structures 300 to render electrical connection between the conductive posts 162 and the routing patterns 506 and between the conductive structures 300 and the routing patterns 506.

In some embodiments, the conductive vias 504 and the routing patterns 506 is formed by the following steps. First, a seed layer (not shown) is deposited onto the dielectric layer 502 and within the openings OP3 of the dielectric layer 502. The seed layer may be formed by a sputtering process, a PVD process, or other applicable methods. In some embodiments, the seed layer includes titanium, copper, or a combination thereof. Subsequently, a mask layer (not shown) having a plurality of openings corresponding to the openings OP3 of the dielectric layer 502 is formed over the seed layer. In other words, the openings of the mask layer exposes the seed layer located in the openings OP3 of the dielectric layer 502 and the seed layer in proximity of the openings OP3. Thereafter, a conductive material layer (not shown) is filled into the openings of the mask layer such that the conductive material layer is formed over the seed layer located in the openings of the mask layer. The conductive material layer may be formed by a plating process. The plating process is, for example, an electro-plating process, an electroless-plating process, an immersion plating process, or the like. In some embodiments, the conductive material layer includes aluminum, titanium, copper, nickel, tungsten, and/or alloys thereof. Next, the mask layer and a portion of the seed layer not covered by the conductive material layer are removed. The conductive material layer and the remaining seed layer constitute the conductive vias 504 and the routing patterns 506. In some embodiments, a material of the conductive vias 504 and the routing patterns 506 includes aluminum, titanium, copper, nickel, tungsten, and/or alloys thereof.

Figure 3F:
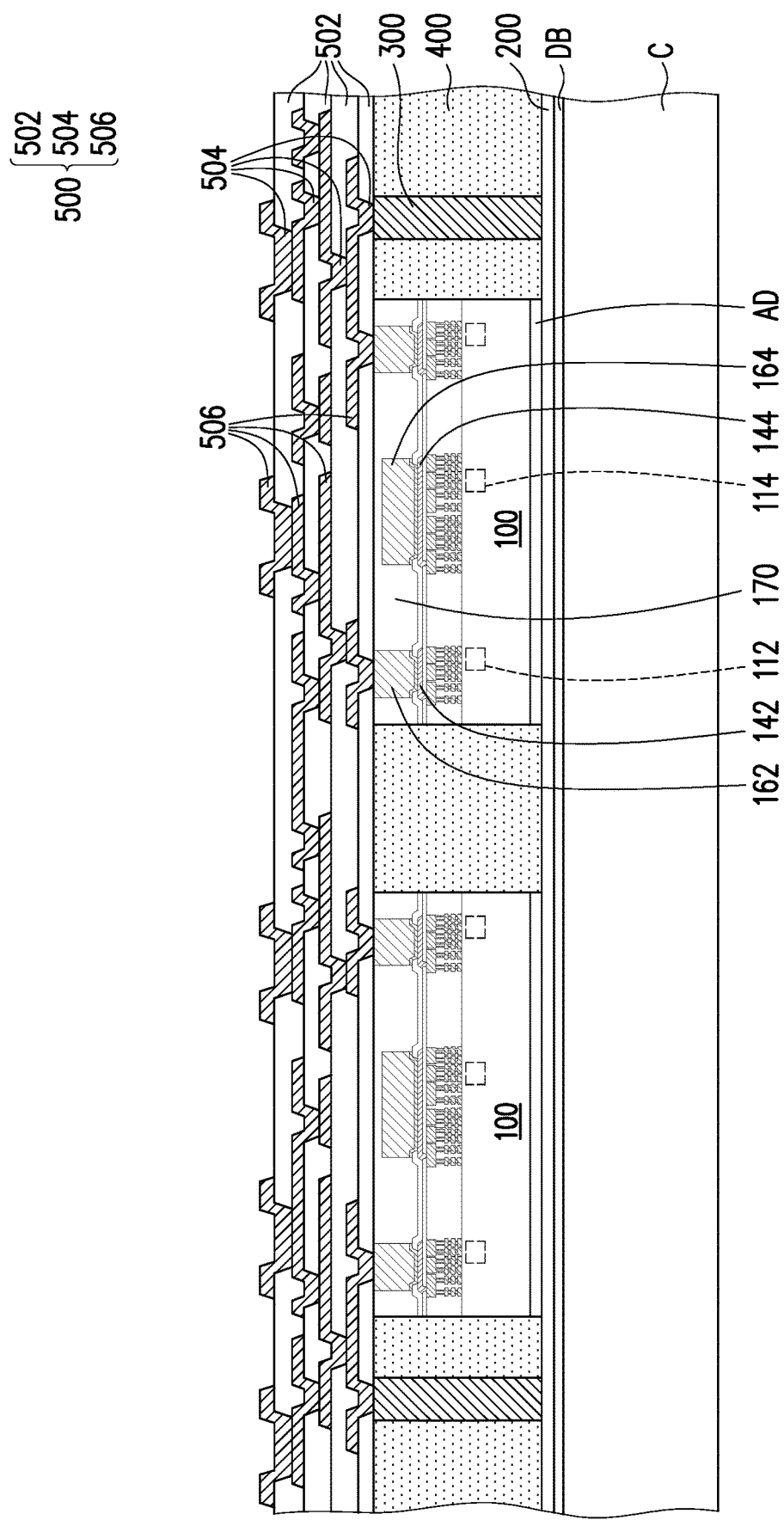

Referring to FIG. 3F, the steps illustrated in FIG. 3D to FIG. 3E is repeated couple times to form a redistribution structure 500. In some embodiments, the redistribution structure 500 includes the dielectric layers 502, the conductive vias 504, and the routing patterns 506. In some embodiments, the redistribution structure 500 is disposed on the integrated circuits 100, the conductive structures 300, and the encapsulant 400. In some embodiments, the redistribution structure 500 is electrically connected to the integrated circuits 100 and the conductive structures 300. For example, the conductive vias 504 and the routing patterns 506 are electrically connected to the conductive posts 162 of the integrated circuits 100 and the conductive structures 300. As illustrated in FIG. 3F, the conductive posts 162 of the integrated circuits 100 are directly in contact with the conductive vias 504 of the redistribution structure 500 to render electrical connection with the redistribution structure 500. That is, the functional components 112 of the integrated circuits 100 are electrically connected to the redistribution structure 500 through the conductive posts 162 and the contact pads 142, so as to be functional (contribute to the operation) during the operation of the subsequently formed package structure 10. On the other hand, the dummy posts 164 are spaced apart from the redistribution structure 500. For example, the dummy posts 164 are electrically insulated from the redistribution structure 500 by the protection layer 170. That is, the dummy posts 164, the testing pads 144, and the testing components 114 of the integrated circuits 100 are electrically floating. As such, during operation of the subsequently formed package structure 10, the testing components 114 are not functional. In some embodiments, the topmost routing patterns 506 may be referred to as "under-ball metallurgy (UBM) patterns."

It should be noted that the number of the dielectric layers 502, the number of the conductive vias 504, and the number of the routing patterns 506 depicted in FIG. 3F merely serve as exemplary illustrations, and the disclosure is not limited thereto. In some alternative embodiments, fewer or more dielectric layers, conductive vias, and/or routing patterns may be adapted based on circuit design.

Figure 3G:
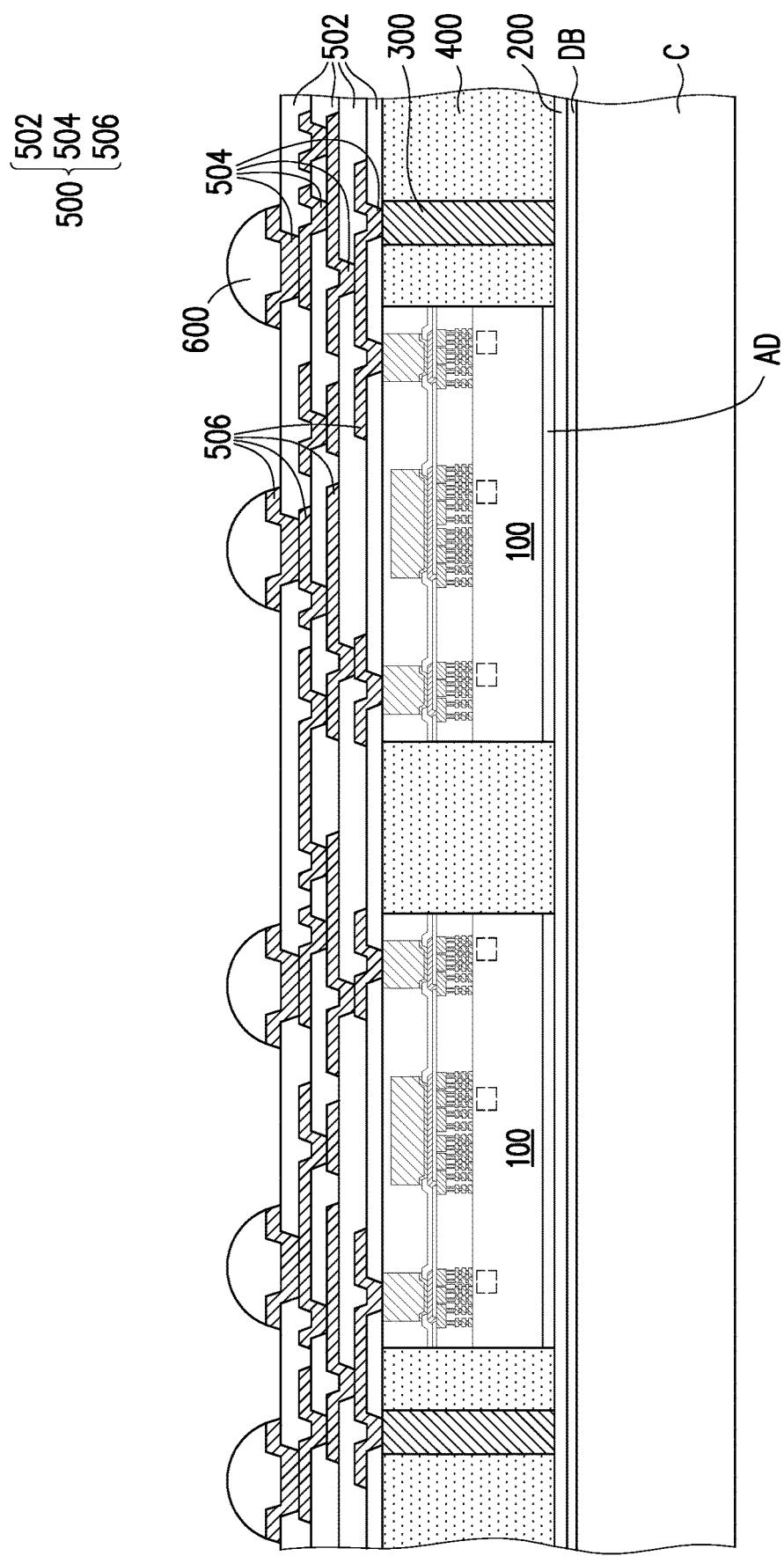

Referring to FIG. 3G, a plurality of conductive terminals 600 is placed on the UBM patterns (the topmost routing patterns 506). In some embodiments, the conductive terminals 600 are attached to the UBM patterns (the topmost routing patterns 506) through a solder flux. In some embodiments, the conductive terminals 600 are ball grid array (BGA) connectors, solder balls, metal pillars, and/or the like. In some embodiments, the conductive terminals 600 are made of a conductive material with low resistivity, such as Sn, Pb, Ag, Cu, Ni, Bi, or an alloy thereof. In some embodiments, the conductive terminals 600 may be disposed on the redistribution structure 500 through a ball placement process and/or a reflow process.

Figure 3H:
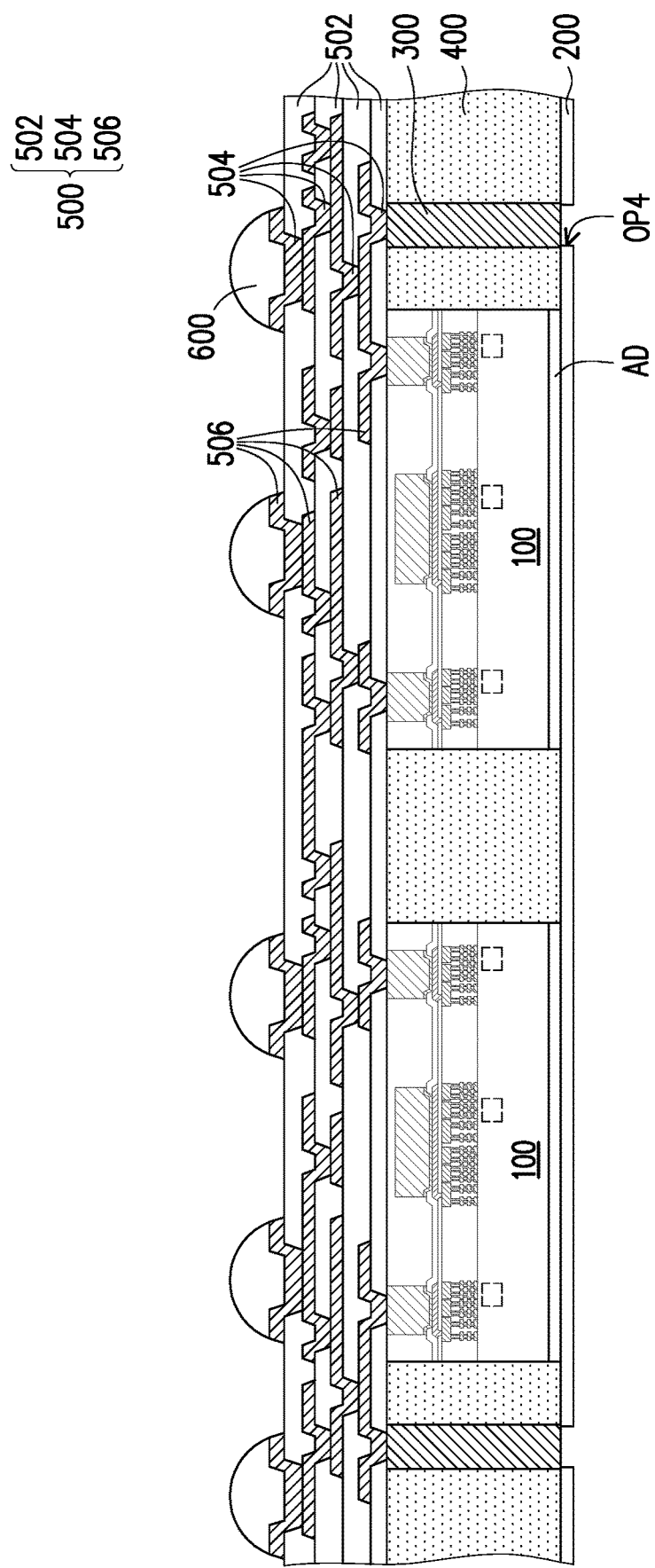

Referring to FIG. 3G and FIG. 3H, the dielectric layer 200 formed on the bottom surface of the encapsulant 400 is de-bonded from the de-bonding layer DB such that the dielectric layer 200 is separated from the carrier C. That is, the carrier C and the de-bonding layer DB are removed. In some embodiments, the de-bonding layer DB (e.g., the LTHC release layer) may be irradiated by an UV laser such that the dielectric layer 200 is peeled off from the carrier C and the de-bonding layer DB. As illustrated in FIG. 3H, the dielectric layer 200 is then patterned such that a plurality of contact openings OP4 is formed to partially expose the conductive structures 300. In some embodiments, the contact openings OP4 of the dielectric layer 200 are formed by a laser drilling process, a mechanical drilling process, or other suitable processes.

Figure 3I:
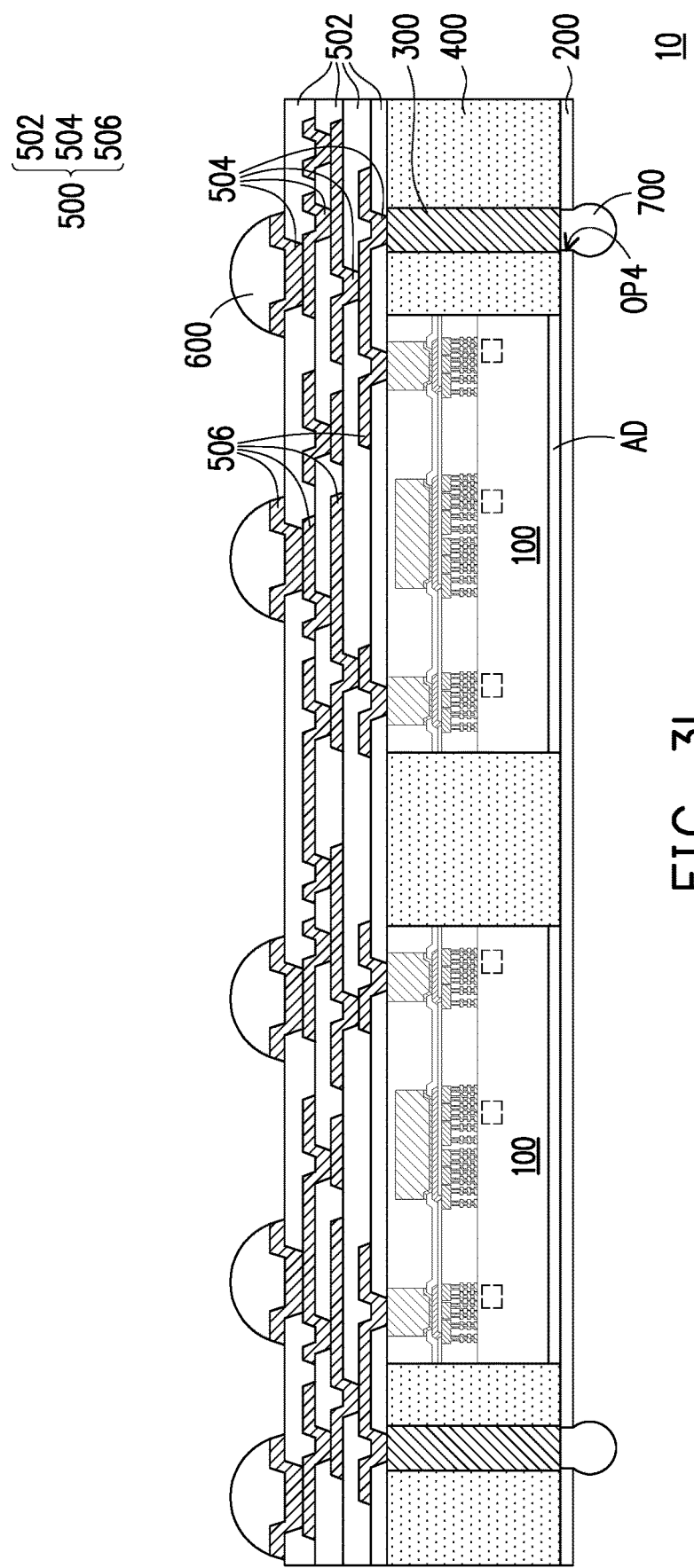

Referring to FIG. 3H and FIG. 3I, a plurality of conductive terminals 700 is placed in the contact openings OP4. The conductive terminals 700 are electrically connected to the conductive structures 300. The conductive terminals 700 are similar to the conductive terminals 600, so the detailed descriptions thereof are omitted herein. Thereafter, a singulation process is performed to obtain a plurality of package structures 10. In some embodiment, the dicing process or singulation process typically involves dicing with a rotating blade or a laser beam. In other words, the dicing or singulation process is, for example, a laser cutting process, a mechanical cutting process, or other suitable processes. In some embodiments, the package structure 10 may be referred to as an "integrated fan-out (InFO) package structure."

Figure 4A:
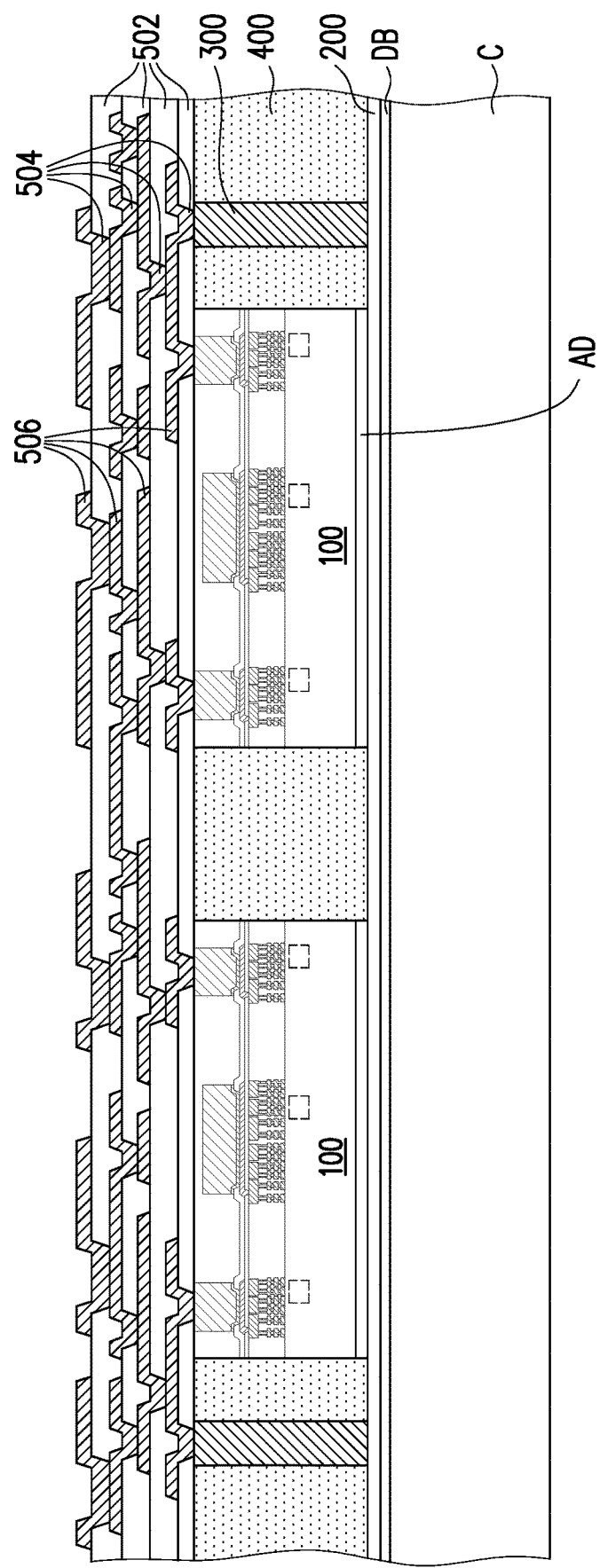
FIG. 4A to FIG. 4H are schematic cross-sectional views illustrating a manufacturing process of a package structure in accordance with some alternative embodiments of the disclosure.

FIG. 4A to FIG. 4H are schematic cross-sectional views illustrating a manufacturing process of a package structure 20 in accordance with some alternative embodiments of the disclosure. Referring to FIG. 4A, the structure illustrated in FIG. 4A is similar to the structure illustrated in FIG. 3F, so similar elements are denoted by the same reference numeral and the detailed descriptions thereof are omitted herein. In other words, the structure illustrated in FIG. 4A may be obtained by performing the steps illustrated in FIG. 3A to FIG. 3F.

Figure 4B:
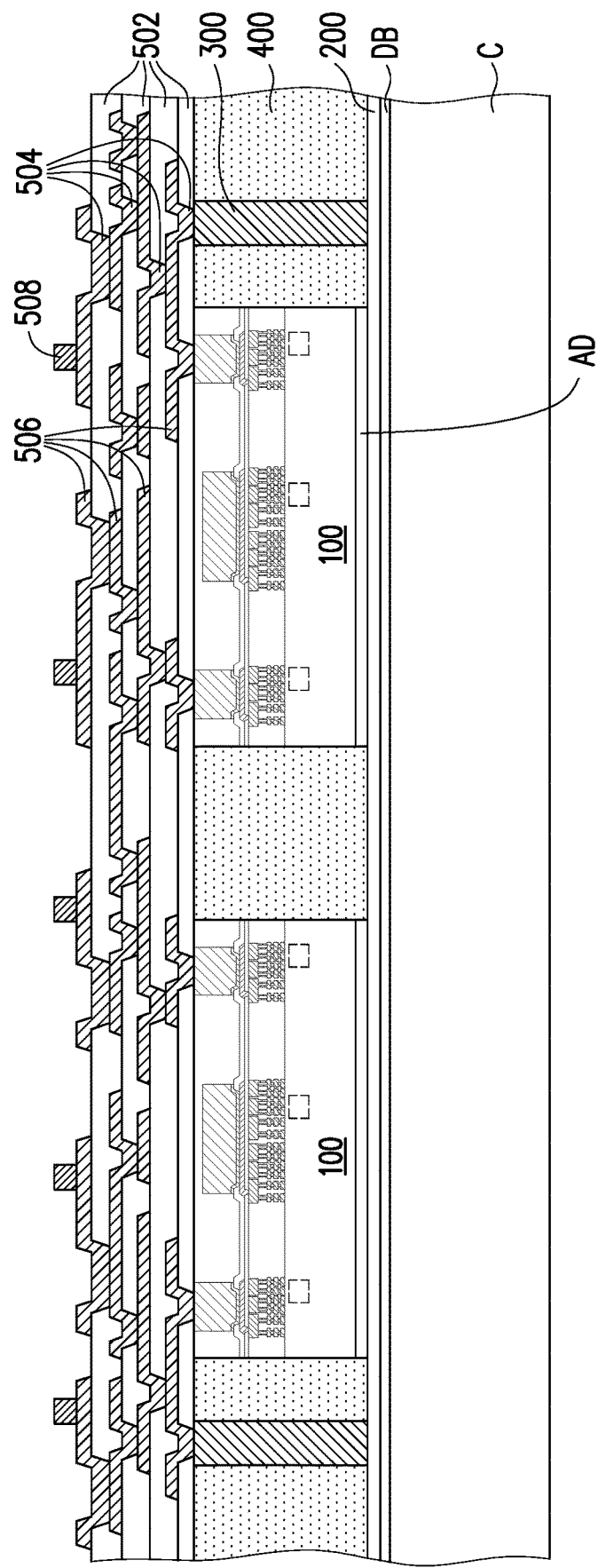

Referring to FIG. 4B, a plurality of conductive vias 508 is formed on the topmost routing patterns 506. In some embodiments, the conductive vias 508 may be formed by the following steps. First a seed layer (not shown) is conformally formed on the topmost dielectric layer 502 and the topmost routing patterns 506. The seed layer may be formed through, for example, a sputtering process, a PVD process, or the like. In some embodiments, the seed layer includes titanium, copper, or a combination thereof. Subsequently, a mask layer (not shown) having a plurality of openings is formed over the seed layer. The openings of the mask layer partially expose the underlying seed layer. Thereafter, a conductive material layer (not shown) is filled into the openings of the mask layer such that the conductive material layer is formed over the seed layer located in the openings of the mask layer. The conductive material layer may be formed by a plating process. The plating process is, for example, an electro-plating process, an electroless-plating process, an immersion plating process, or the like. Next, the mask layer and a portion of the seed layer not covered by the conductive material layer are removed. The conductive material layer and the remaining seed layer constitute the conductive vias 508. In some embodiments, the material of the conductive vias 508 may be the same as the materials of the conductive vias 504 and the routing patterns 506. However, the disclosure is not limited thereto. In some alternative embodiments, the materials of the conductive vias 508 may be different from the materials of the conductive vias 504 and the routing patterns 506.

Figure 4C:
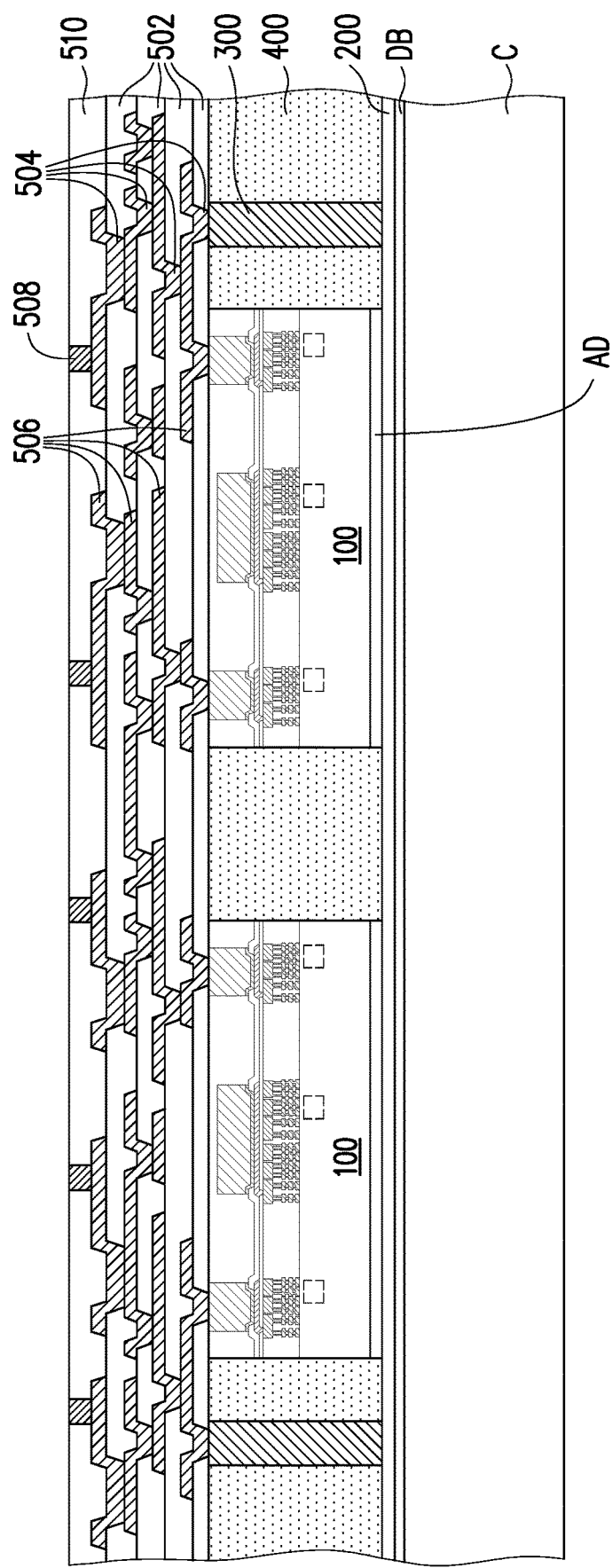

Referring to FIG. 4C, a dielectric layer 510 is formed over the topmost dielectric layer 502 and the topmost routing patterns 506 to laterally encapsulate the conductive vias 508. In some embodiments, a material of the dielectric layer 510 includes a molding compound, a molding underfill, or the like. In some alternative embodiments, the material of the dielectric layer 510 includes polyimide, epoxy resin, acrylic resin, phenol resin, BCB, PBO, or any other suitable polymer-based dielectric material. In some embodiments, the material of the dielectric layer 510 is different from the material of the dielectric layers 502. In some embodiments, the dielectric layer 510 is formed by the following steps. First, a dielectric material layer (not shown) is formed over the topmost dielectric layer 502, the topmost routing patterns 506, and the conductive vias 508. In other words, the conductive vias 508 are not revealed and are well protected by the dielectric material layer. In some embodiments, the dielectric material layer is formed by suitable fabrication techniques, such as spin-on coating, CVD, PECVD, or the like. Subsequently, a portion of the dielectric material layer is removed until the conductive vias 508 are exposed, so as to form the dielectric layer 510. The dielectric material layer may be removed through a mechanical grinding process and/or a CMP process. As illustrated in FIG. 4C, a top surface of the dielectric layer 510 is substantially coplanar with top surfaces of the conductive vias 508.

Figure 4D:
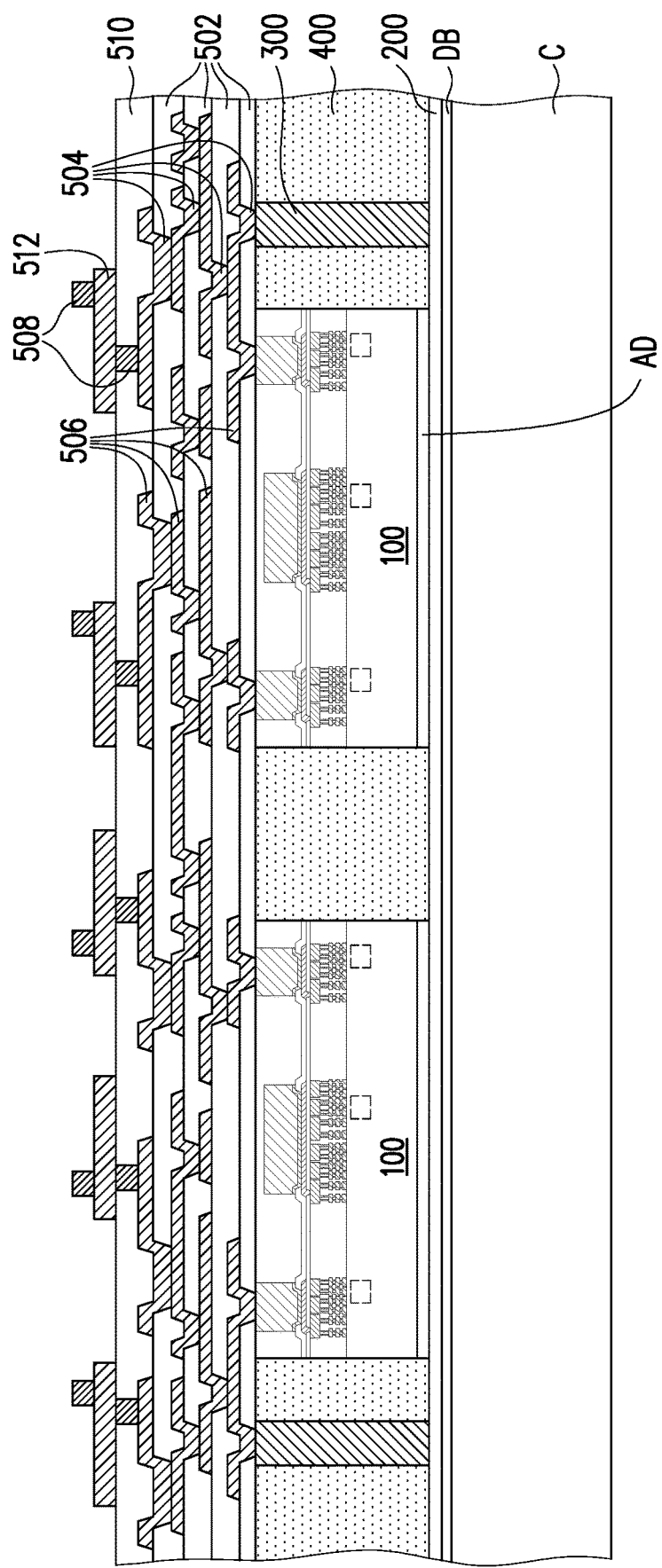

Referring to FIG. 4D, a plurality of routing patterns 512 and a plurality of conductive vias 508 (the topmost conductive vias 508) are sequentially formed over the dielectric layer 510 and the conductive vias 508. In some embodiments, the formation process of the routing patterns 512 and the topmost conductive vias 508 shown in FIG. 4D is similar to the formation process of the underlying conductive vias 508, so the detailed descriptions thereof are omitted herein. It should be noted that the routing patterns 512 and the topmost conductive vias 508 may share the same seed layer, so the partial removal of the seed layer is not performed after the topmost conductive vias 508 are formed on the routing patterns 512. In some embodiments, a material of the routing patterns 512 may be the same as or different from the material of the conductive vias 508. For example, the material of the routing patterns 512 includes aluminum, titanium, copper, nickel, tungsten, and/or alloys thereof. In some embodiments, the routing patterns 512 are electrically connected to the routing patterns 506 through the underlying conductive vias 508.

Figure 4E:
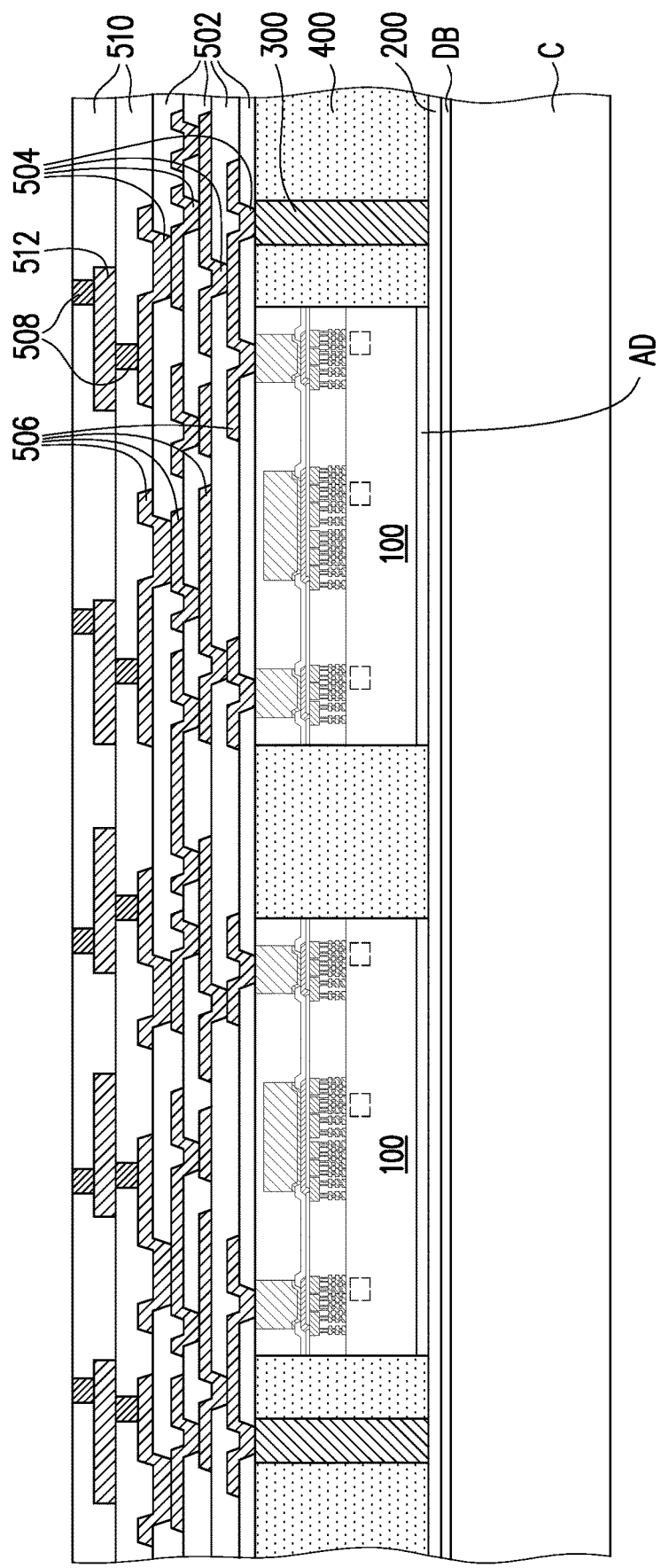

Referring to FIG. 4E, the step illustrated in FIG. 4C is repeated to form another dielectric layer 510 covering the routing patterns 512 and the topmost conductive vias 508.

Figure 4F:
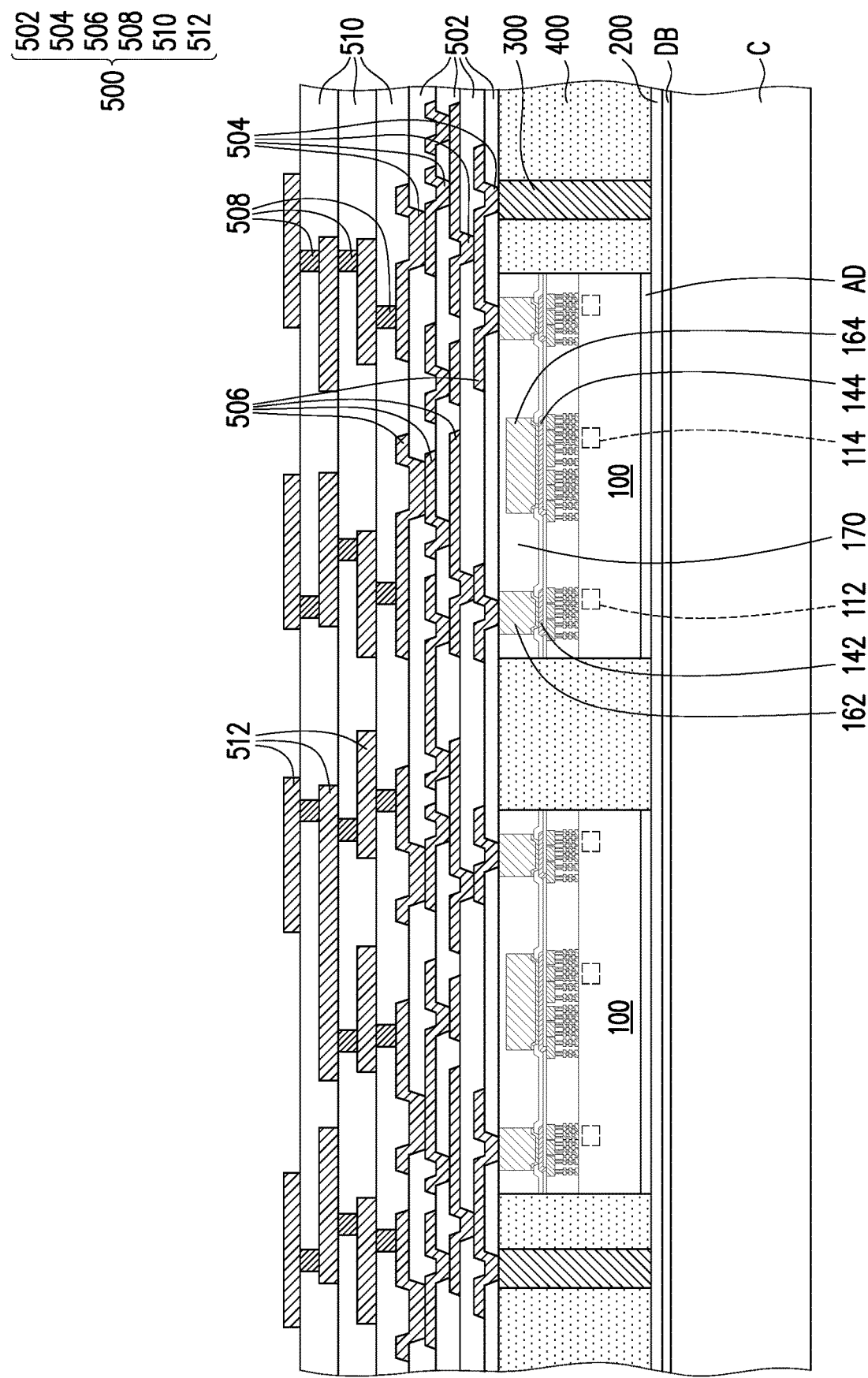

Referring to FIG. 4F, the steps illustrated in FIG. 4D to FIG. 4E is repeated to from a redistribution structure 500. In some embodiments, the redistribution structure 500 includes the dielectric layers 502, the conductive vias 504, the routing patterns 506, the conductive vias 508, the dielectric layer 510, and the routing patterns 512. In some embodiments, the redistribution structure 500 is disposed on the integrated circuits 100, the conductive structures 300, and the encapsulant 400. In some embodiments, the redistribution structure 500 is electrically connected to the integrated circuits 100 and the conductive structures 300. For example, the conductive vias 504, the routing patterns 506, the conductive vias 508, and the routing patterns 512 are electrically connected to the conductive posts 162 of the integrated circuits 100 and the conductive structures 300. As illustrated in FIG. 4F, the conductive posts 162 of the integrated circuits 100 are directly in contact with the conductive vias 504 of the redistribution structure 500 to render electrical connection with the redistribution structure 500. That is, the functional components 112 of the integrated circuits 100 are electrically connected to the redistribution structure 500 through the conductive posts 162 and the contact pads 142, so as to be functional (contribute to the operation) during the operation of the subsequently formed package structure 20. On the other hand, the dummy posts 164 are spaced apart from the redistribution structure 500. For example, the dummy posts 164 are electrically insulated from the redistribution structure 500 by the protection layer 170. That is, the dummy posts 164, the testing pads 144, and the testing components 114 of the integrated circuits 100 are electrically floating. As such, during operation of the subsequently formed package structure 20, the testing components 114 are not functional. In some embodiments, the topmost routing patterns 512 may be referred to as "UBM patterns."

In some embodiments, the steps illustrated in FIG. 4B to FIG. 4F may be referred to as "ultra-high density (UHD) redistribution formation process." It should be noted that the number of the dielectric layers 502, the number of the conductive vias 504, the number of the routing patterns 506, the number of the conductive vais 508, the number of the dielectric layers 510, and the number of the routing patterns 512 depicted in FIG. 4F merely serve as exemplary illustrations, and the disclosure is not limited thereto. In some alternative embodiments, fewer or more dielectric layers, conductive vias, and/or routing patterns may be adapted based on circuit design.

Figure 4G:
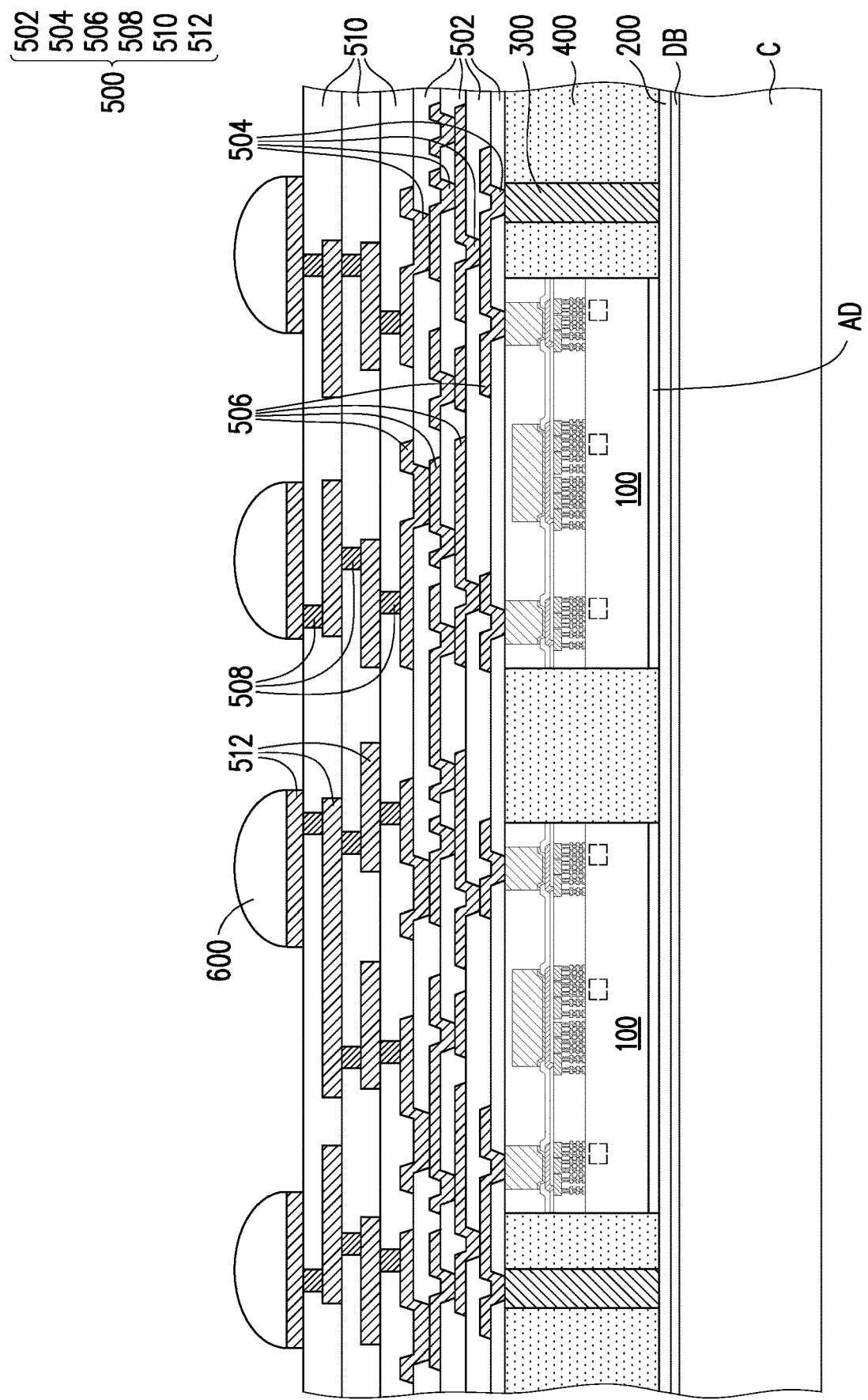

Referring to FIG. 4G, a plurality of conductive terminals 600 is placed on the UBM patterns (the topmost routing patterns 512). In some embodiments, the conductive terminals 600 are attached to the UBM patterns (the topmost routing patterns 512) through a solder flux. In some embodiments, the conductive terminals 600 are ball grid array (BGA) connectors, solder balls, metal pillars, and/or the like. In some embodiments, the conductive terminals 600 are made of a conductive material with low resistivity, such as Sn, Pb, Ag, Cu, Ni, Bi, or an alloy thereof. In some embodiments, the conductive terminals 600 may be disposed on the redistribution structure 500 through a ball placement process and/or a reflow process.

Figure 4H:
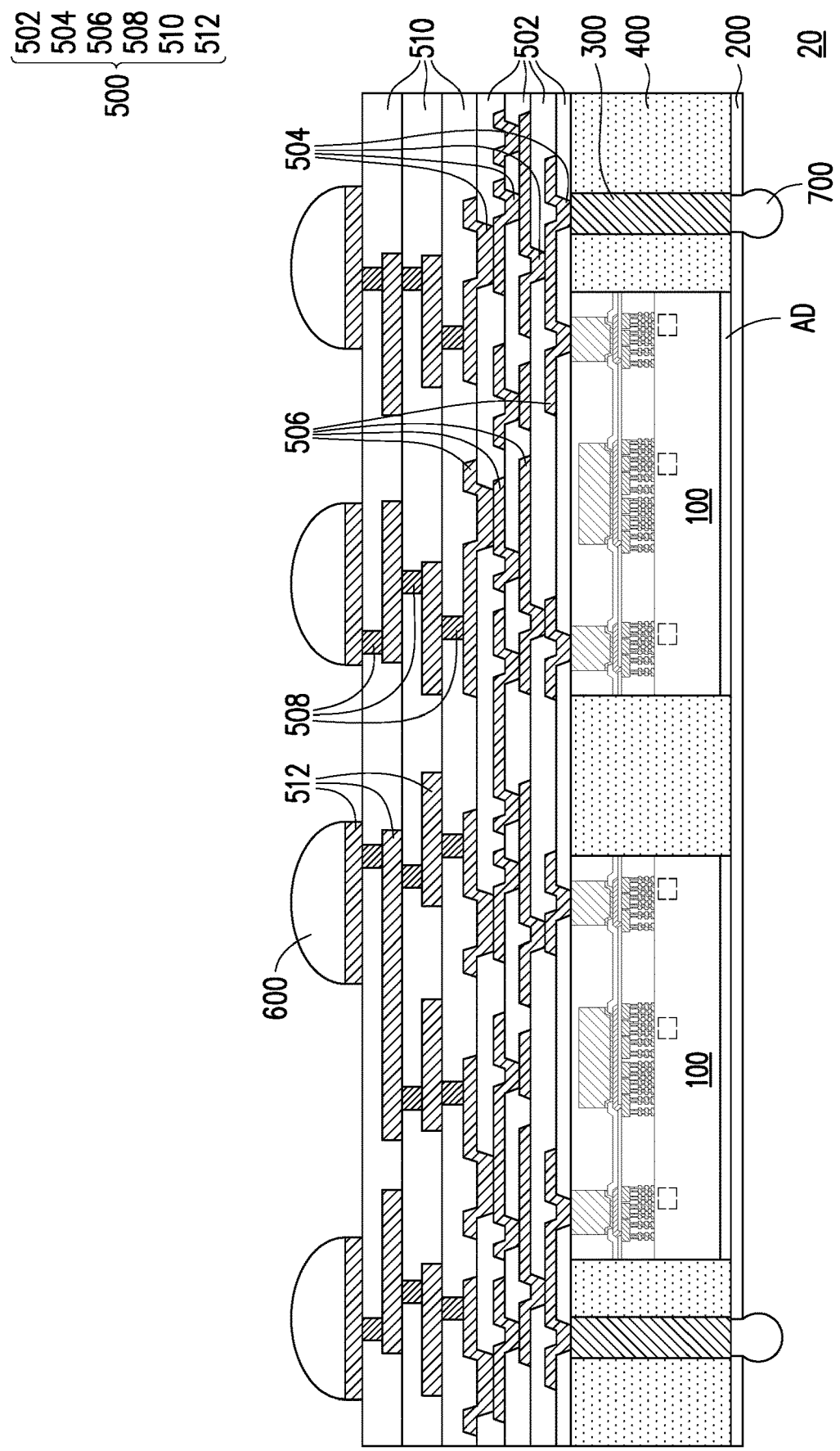

Referring to FIG. 4G to FIG. 4H, steps similar to the steps illustrated in FIG. 3H to FIG. 3I is performed on the structure illustrated in FIG. 4G to obtain a plurality of package structures 20. In some embodiments, the package structure 20 may be referred to as an "InFO package structure."

Figure 5:
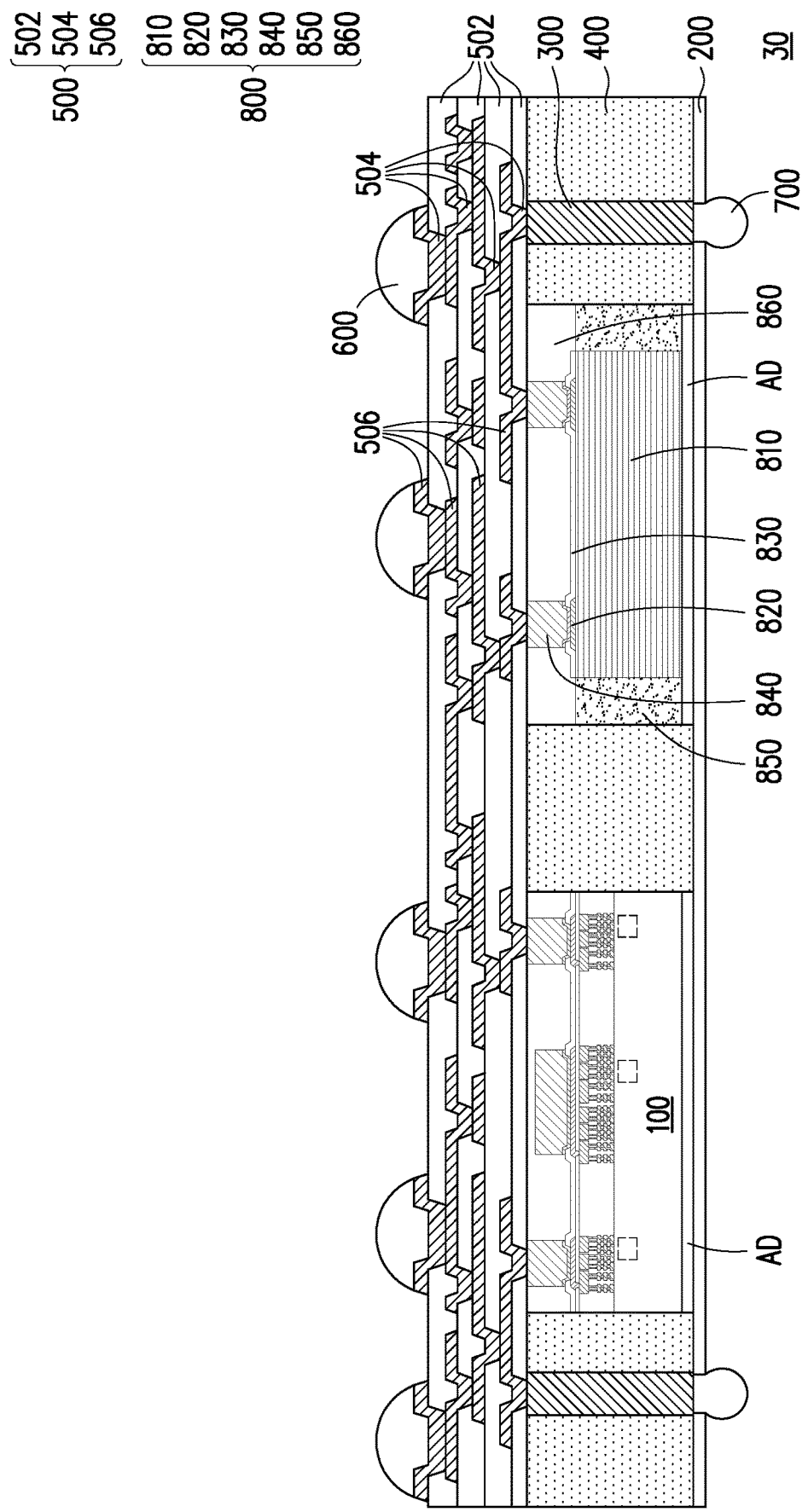
FIG. 5 is a schematic cross-sectional view illustrating a package structure in accordance with some alternative embodiments of the disclosure.

FIG. 5 is a schematic cross-sectional view illustrating a package structure 30 in accordance with some alternative embodiments of the disclosure. Referring to FIG. 5, the package structure 30 in FIG. 5 is similar to the package structure 10 in FIG. 3I, so similar elements are denoted by the same reference numeral and the detailed descriptions thereof are omitted herein. The difference between the package structure 30 illustrated in FIG. 5 and the package structure 10 illustrated in FIG. 3I lies in that one of the integrated circuits 100 in FIG. 3I is replaced by a memory device 800 in FIG. 5.

In some embodiments, the memory device 800 includes a die stack 810, a plurality of conductive pads 820, a passivation layer 830, a plurality of conductive posts 840, an encapsulant 850, and a protection layer 860. In some embodiments, the die stack 810 includes a plurality of dies stacking on one another. In some embodiments, these dies are electrically connected to one another through a plurality of bumps (not shown) therebetween. In some embodiments, each die of the die stack 810 is a semiconductor die and includes active components (e.g., transistors or the like) and/or passive components (e.g., resistors, capacitors, inductors, or the like) formed therein. In some embodiments, the conductive pads 820 are distributed on the die stack 810. The conductive pads 820 are electrically connected to the dies of the die stack 810. In some embodiments, the conductive pads 820 are aluminum pads, copper pads, or other suitable metal pads. In some embodiments, the passivation layer 830 is formed on the die stack 810 and the conductive pads 820. In some embodiments, the passivation layer 830 partially exposes each conductive pad 820. In some embodiments, the passivation layer 830 is formed of a silicon-containing dielectric material such as silicon oxide, silicon nitride, or the like. The passivation layer 830 may be deposited using any suitable method, such as ALD, CVD, HDPCVD, PVD, or the like.

As illustrated in FIG. 5, the conductive posts 840 are formed on the conductive pads 820. That is, the conductive posts 840 are electrically connected to the conductive pads 820. In some embodiments, the material and the formation method of the conductive posts 840 are similar to that of the conductive posts 162 in FIG. 1C to FIG. 1F, so the detailed descriptions thereof are omitted herein. In some embodiments, the conductive posts 840 are directly in contact with the bottommost conductive vias 504 of the redistribution structure 500, so as to render electrical connection between the memory device 800 and the redistribution structure 500. In some embodiments, the encapsulant 850 laterally encapsulates the die stack 810. In some embodiments, the encapsulant 850 includes a molding compound, a molding underfill, a resin (such as epoxy), or the like. In some embodiments, the encapsulant 850 includes fillers. In some embodiments, the encapsulant 850 may be formed by a molding process. For example, the encapsulant 850 may be formed by a compression molding process. In some embodiments, the protection layer 860 is formed on the encapsulant 850 and the passivation 830 to laterally encapsulate the conductive posts 840. The material and the formation method of the protection layer 860 are similar to that of the protection layer 170 in FIG. 1G, so the detailed description thereof is omitted herein. In some embodiments, the memory device 800 may be referred to as a "high bandwidth memory (HBM)." In some embodiments, the package structure 30 may be referred to as an "InFO package structure."

Figure 6:
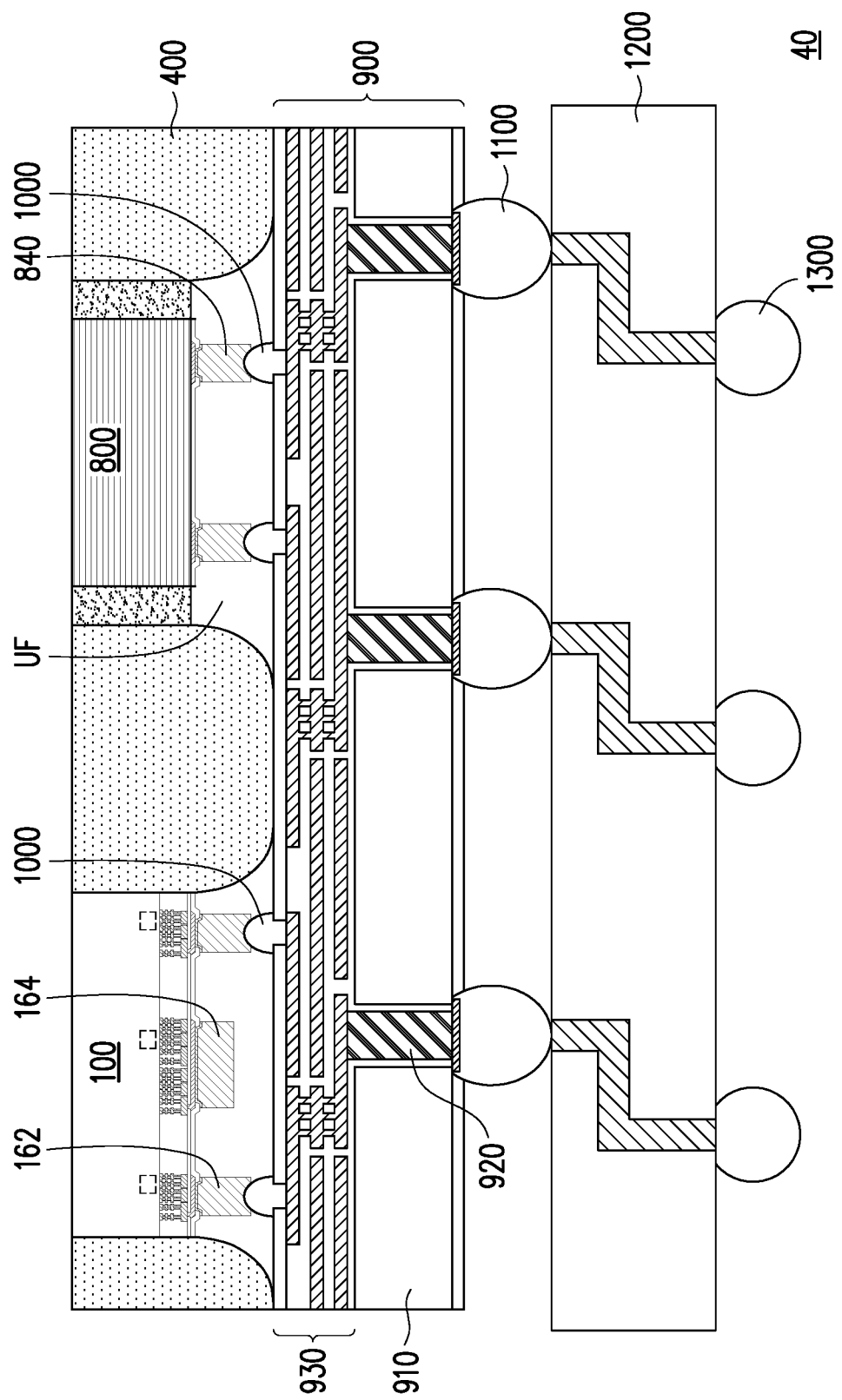
FIG. 6 is a schematic cross-sectional view illustrating a package structure in accordance with some alternative embodiments of the disclosure.

FIG. 6 is a schematic cross-sectional view illustrating a package structure 40 in accordance with some alternative embodiments of the disclosure. Referring to FIG. 6, an integrated circuit 100 and a memory device 800 are bonded to an interposer 900. In some embodiments, the integrated circuit 100 in FIG. 6 is similar to the integrated circuit 100 in FIG. 1H except the protection layer 170 is omitted. On the other hand, the memory device 800 in FIG. 6 is similar to the memory device 800 in FIG. 5 except the protection layer 860 is omitted. Therefore, the detailed descriptions of the integrated circuit 100 and the memory device 800 are omitted herein.

In some embodiments, the interposer 900 includes a substrate 910, a plurality of through vias 920, and a redistribution structure 930. In some embodiments, the substrate 910 may be a semiconductor substrate. For example, the substrate 910 may be made of a suitable elemental semiconductor, such as crystalline silicon, diamond, or germanium; a suitable compound semiconductor, such as gallium arsenide, silicon carbide, indium arsenide, or indium phosphide; or a suitable alloy semiconductor, such as silicon germanium carbide, gallium arsenic phosphide, or gallium indium phosphide. In some embodiments, the through vias 920 penetrate through the substrate 910. In some embodiments, the through vias 920 are made of a conductive material. For example, the material of the through vias 920 includes aluminum, titanium, copper, nickel, tungsten, and/or alloys thereof. The redistribution structure 930 is disposed on the substrate 910 and is electrically connected to the through vias 920. In some embodiments, the redistribution structure 930 includes a plurality of dielectric layers and a plurality of conductive pattern layers stacked alternately. The adjacent conductive patterns layers are electrically connected to each other through conductive vias sandwiched therebetween.

In some embodiments, the integrated circuit 100 and the memory device 800 are attached to the interposer 900 through a flip-chip bonding process. For example, the integrated circuit 100 and the memory device 800 are bonded to the interposer 900 through a plurality of conductive terminals 1000. In some embodiments, the conductive posts 162 of the integrated circuit 100 and the conductive posts 840 of the memory device 800 are electrically connected to the redistribution structure 930 of the interposer 900 through the conductive terminals 1000. In some embodiments, the conductive terminals 1000 are, for example, solder balls, ball grid array (BGA) balls, or controlled collapse chip connection (C4) bumps. In some embodiments, the conductive terminals 1000 are made of a conductive material with low resistivity, such as Sn, Pb, Ag, Cu, Ni, Bi, or an alloy thereof.

In some embodiments, the integrated circuit 100 and the memory device 800 are laterally encapsulated by an encapsulant 400. The encapsulant 400 in FIG. 6 is similar to the encapsulant in FIG. 3C, so the detailed description thereof is omitted herein. In some embodiment, an underfill UF is filled between the integrated circuit 100 and the interposer 900 to protect the conductive posts 162. Similarly, the underfill UF is also filled between the memory device 800 and the interposer 900 to protect the conductive posts 840. In some embodiments, the dummy posts 164 of the integrated circuit 100 are protected by the underfill UF. That is, the dummy posts 164 are electrically isolated from the interposer 900 and the memory device 800 with the aid of the underfill UF. In some embodiments, the dummy posts 164 are electrically floating.

In some embodiments, the interposer 900 is mounted on a circuit substrate 1200. In some embodiments, the circuit substrate 1200 includes a printed circuit board (PCB) or the like. In some embodiments, the interposer 900 is attached to the circuit substrate 1200 through a plurality of conductive terminals 1100. On the other hand, a plurality of conductive terminals 1300 is formed on the circuit substrate 1200 opposite to the interposer 900. The conductive terminals 1100 and the conductive terminals 1300 are similar to the conductive terminals 1000, so the detailed descriptions thereof are omitted herein. In some embodiments, the package structure 40 may be referred to as a "chip-on-wafer-on-substrate (CoWoS) package structure."

In accordance with some embodiments of the disclosure, an integrated circuit includes a semiconductor substrate, contact pads, testing pads, conductive posts, and dummy posts. The contact pads and the test pads are distributed over the semiconductor substrate. The conductive posts are disposed on the contact pads. The dummy posts are disposed on the testing pads. A height of the conductive posts is greater than a height of the dummy posts.

In accordance with some embodiments of the disclosure, a package structure includes an integrated circuit, an encapsulant, and a redistribution structure. The integrated circuit includes a semiconductor substrate, contact pads, testing pads, conductive posts, and dummy posts. The contact pads and the test pads are distributed over the semiconductor substrate. The conductive posts are disposed on the contact pads. The dummy posts are disposed on the testing pads. The dummy posts are electrically floating. The encapsulant laterally encapsulates the integrated circuit. The redistribution structure is disposed on the integrated circuit and the encapsulant. The conductive posts are electrically connected to the redistribution structure.

In accordance with some embodiments of the disclosure, a manufacturing method of a package structure includes at least the following steps. An integrated circuit is formed. The integrated circuit is encapsulated by an encapsulant. A redistribution structure is formed over the integrated circuit and the encapsulant. The integrated circuit is formed by at least the following steps. A semiconductor wafer is provided. Contact pads and testing pads are formed over the semiconductor wafer. A passivation layer is formed over the contact pads and the testing pads. The passivation layer partially exposes each contact pad and each testing pad. Conductive posts are formed on the contact pads. Dummy posts are formed on the testing pads. The dummy posts are formed to be shorter than the conductive posts.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit, comprising:
   a semiconductor substrate;
   contact pads and testing pads distributed over the semiconductor substrate;
   conductive posts disposed on the contact pads; and
   dummy posts disposed on the testing pads, wherein a height of the conductive posts is greater than a height of the dummy posts, and the dummy posts are electrically floating.

2. The integrated circuit of claim 1, further comprising a protection layer covering the conductive posts and the dummy posts.

3. The integrated circuit of claim 1, wherein a size of the testing pads is greater than a size of the contact pads.

4. The integrated circuit of claim 1, wherein a ratio of a width of the testing pads to a width of the contact pads ranges between 2:1 and 5:1.

5. The integrated circuit of claim 1, wherein each dummy post comprises a seed layer and a conductive material layer, the seed layer covers the testing pad and the conductive material layer is disposed on the seed layer.

6. The integrated circuit of claim 1, further comprising functional components and testing components embedded in the semiconductor substrate, wherein the conductive posts and the contact pads are electrically connected to the functional components, and the dummy posts and the testing pads are electrically connected to the testing components.

7. The integrated circuit of claim 1, wherein a width of the dummy posts is greater than a width of the conductive posts.

8. A package structure, comprising:
   an integrated circuit, comprising:
      a semiconductor substrate;
      contact pads and testing pads distributed over the semiconductor substrate;
      conductive posts disposed on the contact pads; and
      dummy posts disposed on the testing pads, wherein the dummy posts are electrically floating;
   an encapsulant laterally encapsulating the integrated circuit; and
   a redistribution structure disposed on the integrated circuit and the encapsulant, wherein the conductive posts are electrically connected to the redistribution structure.

9. The package structure of claim 8, wherein a height of the conductive posts is greater than a height of the dummy posts.

10. The package structure of claim 8, wherein a size of the testing pads is greater than a size of the contact pads.

11. The package structure of claim 8, wherein the dummy posts are electrically insulated from the redistribution structure.

12. The package structure of claim 8, wherein the conductive posts are directly in contact with the redistribution structure, and the dummy posts are spaced apart from the redistribution structure.

13. The package structure of claim 8, wherein a width of the dummy posts is greater than a width of the conductive posts.

14. The package structure of claim 8, wherein the integrated circuit further comprises a protection layer, the protection layer covers sidewalls of the conductive posts, and the protection layer covers both sidewalls and top surfaces of the dummy posts.

15. The package structure of claim 8, wherein each dummy post comprises a seed layer and a conductive material layer, the seed layer covers the testing pad and the conductive material layer is disposed on the seed layer.

16. A manufacturing method of a package structure, comprising:
   forming an integrated circuit, comprising:
      providing a semiconductor wafer;
      forming contact pads and testing pads over the semiconductor wafer;
      forming a passivation layer over the contact pads and the testing pads, wherein the passivation layer partially exposes each contact pad and each testing pad;
      forming conductive posts on the contact pads; and
      forming dummy posts on the testing pads, wherein the dummy posts are formed to be shorter than the conductive posts, and the dummy posts are formed to be electrically floating;

encapsulating the integrated circuit by an encapsulant; and forming a redistribution structure over the integrated circuit and the encapsulant such that the conductive posts are electrically connected to the redistribution structure.

17. The method of claim 16, further comprising:

performing a wafer testing operation on the testing pads prior to the formation of the dummy posts.

18. The method of claim 16, wherein the conductive posts and the dummy posts are simultaneously formed.

19. The method of claim 16, wherein forming the conductive posts and the dummy posts comprises:

depositing a seed layer on the passivation layer, the contact pads, and the testing pads;

forming a photoresist layer over the seed layer, wherein the photoresist layer comprises openings, and the openings partially expose the seed layer above the contact pads and the testing pads;

filling a conductive material layer into the openings of the photoresist layer;

removing the photoresist layer and the seed layer uncovered by the conductive material layer to form the conductive posts and the dummy posts.

20. The method of claim 16, wherein the conductive posts are formed to be slimmer than the dummy posts.

* * * * *